United States Patent
Uchida et al.

(10) Patent No.: US 9,893,642 B2
(45) Date of Patent: Feb. 13, 2018

(54) POWER MODULE

(71) Applicant: JTEKT CORPORATION, Osaka-shi, Osaka (JP)

(72) Inventors: Nobuhiro Uchida, Yamatotakada (JP); Motoo Nakai, Nara (JP)

(73) Assignee: JTEKT CORPORATION, Osaka-shi (JP)

( * ) Notice: Subject to any disclaimer, the term of this patent is extended or adjusted under 35 U.S.C. 154(b) by 0 days.

(21) Appl. No.: 15/601,121

(22) Filed: May 22, 2017

(65) Prior Publication Data

US 2017/0353119 A1    Dec. 7, 2017

(30) Foreign Application Priority Data

Jun. 2, 2016 (JP) ................................. 2016-111218

(51) Int. Cl.
*H02M 7/00* (2006.01)
*H02M 1/44* (2007.01)

(52) U.S. Cl.
CPC ............. *H02M 7/003* (2013.01); *H02M 1/44* (2013.01)

(58) Field of Classification Search
CPC ................................. H02M 7/003; H02M 1/44
See application file for complete search history.

(56) References Cited

U.S. PATENT DOCUMENTS

| | | | | |
|---|---|---|---|---|
| 4,975,824 A * | 12/1990 | Huss | ..................... | H02K 11/046 363/132 |
| 4,975,825 A * | 12/1990 | Huss | ..................... | H01L 25/112 257/E25.025 |
| 6,327,165 B1 * | 12/2001 | Yamane | ................ | H02M 7/003 363/132 |

(Continued)

FOREIGN PATENT DOCUMENTS

| | | |
|---|---|---|
| EP | 1 376 696 A1 | 1/2004 |
| JP | 2008-174160 A | 7/2008 |

(Continued)

OTHER PUBLICATIONS

Nov. 29, 2017 Extended European Search Report issued in European Application No. 17173570.7.

*Primary Examiner* — Jue Zhang
(74) *Attorney, Agent, or Firm* — Oliff PLC

(57) ABSTRACT

A power module includes a multilayer circuit board, and first and second three-phase inverters, which are mounted on the multilayer circuit board to be stacked each other. A positive-electrode-side power source conductive trace of the first three-phase inverter and a negative-electrode-side power source conductive trace of the second three-phase inverter are disposed to at least partially face each other in a stacking direction of the multilayer circuit board, such that currents respectively flow through the power source conductive traces in opposite directions in a facing section. A negative-electrode-side power source conductive trace of the first three-phase inverter and a positive-electrode-side power (Continued)

source conductive trace of the second three-phase inverter are disposed to at least partially face each other in the stacking direction of the multilayer circuit board), such that currents respectively flow through the power source conductive traces in opposite directions in a facing section.

6 Claims, 14 Drawing Sheets

(56) References Cited

U.S. PATENT DOCUMENTS

| | | | | |
|---|---|---|---|---|
| 6,843,335 | B2 * | 1/2005 | Shirakawa | B60L 11/1803 180/65.1 |
| 6,987,670 | B2 * | 1/2006 | Ahmed | H01L 24/49 165/80.4 |
| 7,122,890 | B2 * | 10/2006 | Grant | H02M 7/003 257/698 |
| 7,180,763 | B2 * | 2/2007 | Patwardhan | H02M 7/757 363/144 |
| 7,227,259 | B2 * | 6/2007 | Heilbronner | H01L 24/49 257/685 |
| 8,054,633 | B2 * | 11/2011 | Suwa | B60L 1/003 361/637 |
| 8,228,700 | B2 * | 7/2012 | Yahata | H02M 7/003 361/601 |
| 2002/0167828 | A1 * | 11/2002 | Parkhill | H01L 25/072 363/144 |
| 2005/0162875 | A1 * | 7/2005 | Rodriguez | H05K 7/1432 363/68 |
| 2013/0056755 | A1 | 3/2013 | Hatai et al. | |
| 2015/0298727 | A1 | 10/2015 | Kimpara et al. | |

FOREIGN PATENT DOCUMENTS

| | | |
|---|---|---|
| JP | 2015-020586 A | 2/2015 |
| WO | 2013/105225 A1 | 7/2013 |

* cited by examiner

A

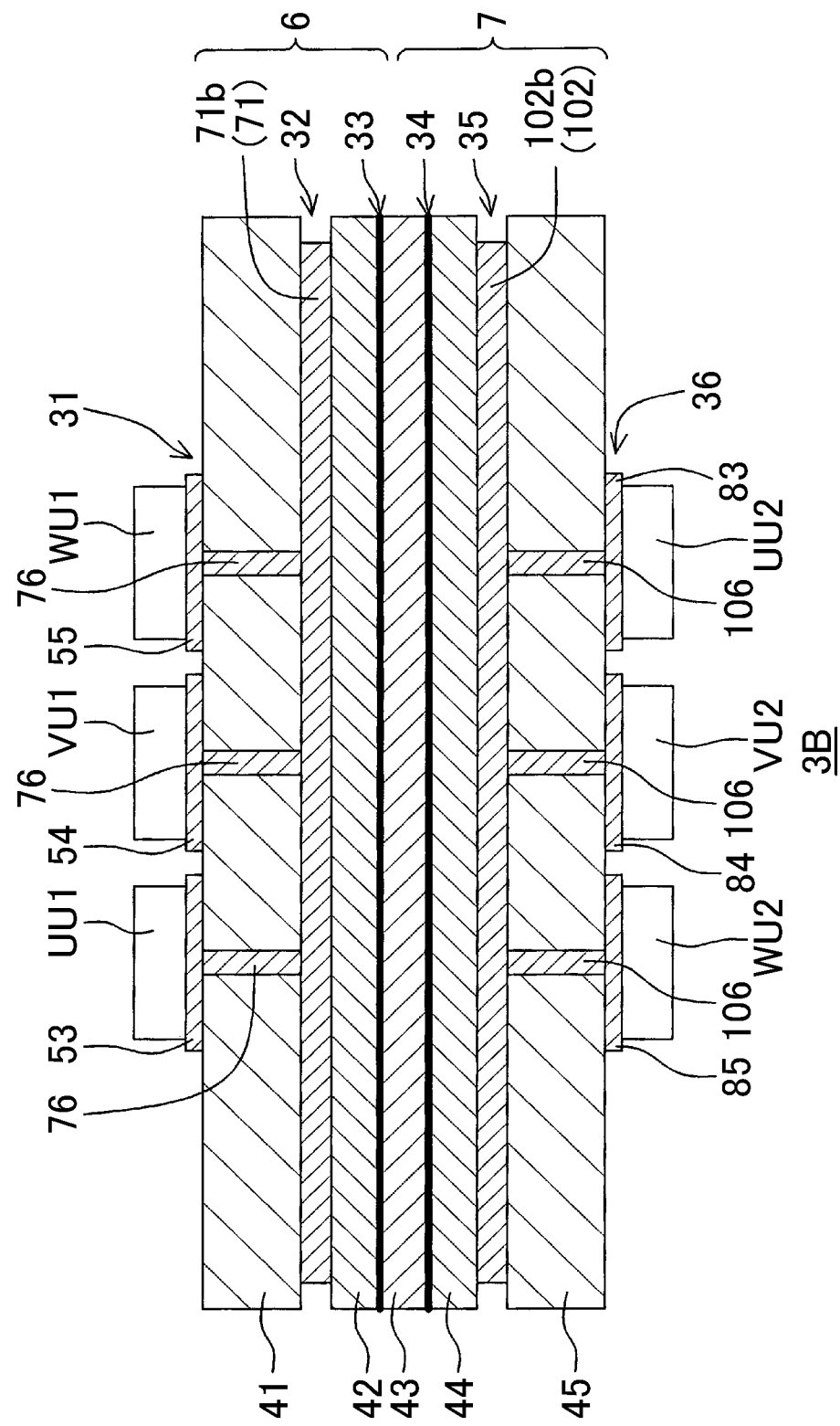

POWER MODULE

INCORPORATION BY REFERENCE

The disclosure of Japanese Patent Application No. 2016-111218 filed on Jun. 2, 2016 including the specification, drawings and abstract, is incorporated herein by reference in its entirety.

BACKGROUND OF THE INVENTION

1. Field of the Invention

The invention relates to a poi module including three-phase in for two systems.

2. Description of the Related Art

There is an electric power steering system including an electric motor provided with motor coils for two systems, three-phase inverters (driving circuits) for the two systems, corresponding respectively to the motor coils for the two systems, and a controller configured to control both of the three-phase inverters. Refer to WO 2011/105225. Hereinafter, one of the motor coils for the two systems will be referred to as "first motor coil", and the other one of the motor coils for the two systems will be referred to as "second motor coil". Hereinafter, one of the three-phase inverters for the two systems will be referred to as "first three-phase inverter", and the other one of the three-phase inverters for the two systems will be referred to as "second three-phase inverter".

In the electric power steering system, the controller includes, for example, a current command value setting unit, a command value distribution unit, a first control unit configured to control driving of the first three-phase inverter, and a second control unit configured to control driving of the second three-phase inverter. The current command value setting unit sets a current command value for the electric motor. The command value distribution unit distributes the current command value set by the current command value setting unit, to the first control unit and the second control unit. The command value distribution unit distributes, for example, half of the current command value to each of the first control unit and the second control unit.

The first control unit controls driving of the first three-phase inverter such that a current flowing through the first motor coil becomes equal to the current command value distributed to the first control unit by the command value distribution unit. The second control unit controls driving of the second three-phase inverter such that a current flowing through the second motor coil becomes equal to the current command valise distributed to the second control unit by the command value distribution unit.

There is a vehicle steering system including right and left steering operation mechanisms that respectively steer right and left steered wheels, and that are respectively driven by right and left steering motors. Refer to Japanese Patent Application Publication No. 2008-174160 (JP 2008-174160 A), and Japanese Patent Application Publication No. 2015-20586 (JP 2015-20586 A). The vehicle steering system includes a first three-phase inverter (driving circuit) configured to drive a left-side steering motor, a second three-phase inverter (driving circuit) configured to drive a right-side steering motor, and a controller configured to control the three-phase inverters. That is, the vehicle steering system includes the three-phase inverter for two systems, like the electric power steering system described above.

In the electric power steering system and the vehicle steering system, a large current flows through each three-phase inverter (driving circuit), and thus a high surge voltage is generated at the time of switching of switching devices in the three-phase inverter.

SUMMARY OF THE INVENTION

One object of the invention is to provide a power module including three-phase inverters for two systems, the power module being configured to reduce an inductance of internal conductive trace.

A power module according to an aspect of the invention includes: a multilayer circuit board having a first principal surface and a second principal surface that is on an opposite side of the multilayer circuit board from the first principal surface; a first three-phase inverter including first U-phase upper and lower arms, first V-phase upper and lower arms, and first W-phase upper and lower arms; and a second three-phase inverter including second U-phase upper and lower arms, second V-phase upper and lower arms, and second W-phase upper and lower arms. The first three-phase inverter and the second three-phase inverter are mounted on the multilayer circuit hoard so as to be stacked each other. Where a positive-electrode-side power source conductive trace and a negative-electrode-side power source conductive trace of the first three-phase inverter are defined as a first positive-electrode-side power source conductive trace and a first negative-electrode-side power source conductive trace, respectively, and a positive-electrode-side power source conductive trace and a negative-electrode-side power source conductive trace of the second three-phase inverter are defined as a second positive-electrode-side power source conductive trace and a second negative-electrode-side power source conductive trace, respectively, the first positive-electrode-side power source conductive trace and the second negative-electrode-side power source conductive trace are disposed so as to at least partially face each other in a stacking direction of the multilayer circuit board, such that a direction in which a current flows through the first positive-electrode-side power source conductive trace and a direction in which a current flows through the second negative-electrode-side power source conductive trace are opposite to each other, in a facing section in which the first positive-electrode-side power source conductive trace and the second negative-electrode-side power source conductive trace at least partially face each other, and the first negative-electrode-side power source conductive trace and the second positive-electrode-side power source conductive trace are disposed so as to at least partially face each other in the stacking direction of the multilayer circuit board, such that a direction in which a current flows through the first negative-electrode-side power source conductive trace and a direction in which a current flows through the second positive-electrode-side power source conductive trace are opposite to each other, in a facing section in which the first negative-electrode-side power source conductive trace and the second positive-electrode-side power source conductive trace at least partially face each other.

With this configuration, a current flows through the first positive-electrode-side power source conductive trace in a direction opposite to the direction in which a current flows through the second negative-electrode-side power source conductive trace, in the facing section in which the first positive-electrode-side power source conductive trace and the second negative-electrode-side power source conductive trace at least partially face each other. In addition, a current flows through the first negative-electrode-side power source conductive trace in a direction opposite to the direction in which a current flows through the second positive-electrode-side power source conductive trace, in the facing section in which the first negative-electrode-side power source conductive trace and the second positive-electrode-side power source conductive trace at least partially face each other. Thus, inductances of these conductive traces are at least partially cancelled out. As a result, the inductances of the internal conductive traces are reduced. Consequently, surge voltage can be reduced.

In the power module according to the above aspect, where a U-phase conductive trace connecting the first U-phase upper and lower arms to each other, a V-phase conductive trace connecting the first V-phase upper and lower arms to each other, and a W-phase conductive trace connecting the first W-phase upper and lower arms to each other are respectively defined as a first U-phase conductive trace, a first V-phase conductive trace, and a first W-phase conductive trace, and where a U-phase conductive trace connecting the second U-phase upper and lower arms to each other, a V-phase conductive trace connecting the second V-phase upper and lower arms to each other, and a W-phase conductive trace connecting the second W-phase upper and lower arms to each other are respectively defined as a second U-phase conductive trace, a second V-phase conductive trace, and a second W-phase conductive trace, the first U-phase conductive trace and the second U-phase conductive trace may be disposed so as to face each other in the stacking direction of the multilayer circuit board, the first V-phase conductive trace and the second V-phase conductive trace may be disposed so as to face each other in the stacking direction of the multilayer circuit board, and the first W-phase conductive trace and the second W-phase conductive trace may be disposed so as to face each other in the stacking direction of the multilayer circuit board.

With this configuration, controlling the first three-phase inverter and the second three-phase inverter according to a specific control method allows currents in opposite directions to flow in at least a part of the facing section in which the first U-phase conductive trace and the second U-phase conductive trace face each other, in at least a part of the facing section in which the first V-phase conductive trace and the second V-phase conductive trace face each other, and in at least a part of the facing section in which the first W-phase conductive trace and the second W-phase conductive trace face each other. Thus, inductances of these conductive traces are at least partially cancelled out. As a result, the inductances of the internal conductive traces can be reduced. Consequently, surge voltage can be reduced. The specific control method may be a method of controlling the first three-phase inverter and the second three-phase inverter such that, in each of a pair of the U-phase upper and lower arms, a pair of the V-phase upper and lower arms, and a pair of the W-phase upper and lower arms, when the upper arm of the first three-phase inverter is in an on-state, the lower arm of the second three-phase inverter is in an on-state, whereas when the upper arm of the second three-phase inverter is in an on state, the lower arm of the first three-phase inverter is in an on state.

In the power module according to the above aspect, the first U-phase upper and lower arms, the first V-phase upper and lower arms, and the first W-phase upper and lower arms may be mounted on the first principal surface of the multilayer circuit board; the second U-phase upper and lower arms, the second V-phase upper and lower arms, and the second W-phase upper and lower arms may be mounted on the second principal surface of the multilayer circuit board; at least the first positive-electrode-side power source conductive trace and the first negative-electrode-side power source conductive trace among the first positive-electrode-side power source conductive trace, the first negative-electrode-side power source conductive trace, the first U-phase conductive trace, the first V-phase conductive trace, and the first W-phase conductive trace may be provided in a first inner layer between the first principal surface and the second principal surface of the multilayer circuit board; and at least the second positive-electrode-side power source conductive trace and the second negative-electrode-side power source conductive trace among the second positive-electrode-side power source conductive trace, the second negative-electrode-side power source conductive trace, the second U-phase conductive trace, the second V-phase conductive trace, and the second W-phase conductive trace may be provided in a second inner layer between the second principal surface of the multilayer circuit board and the first inner layer.

With this configuration, the first positive-electrode-side power source conductive trace and the first negative-electrode-side power source conductive trace are disposed at positions close to the second negative-electrode-side power source conductive trace and the second positive-electrode.-side power source conductive trace so as to face the second negative-electrode-side power source conductive trace and the second positive-electrode-side power source conductive trace, respectively. Thus, inductances of the conductive traces can be further reduced.

In the power module according to the above aspect, the first positive-electrode-side power source conductive trace, the first negative-electrode-side power source conductive trace, the first U-phase conductive trace, the first V-phase conductive trace, and the first W-phase conductive trace may be provided in the first inner layer, and the second positive-electrode-side power source conductive trace, the second negative-electrode-side power source conductive trace, the second U-phase conductive trace, the second V-phase conductive trace, and the second W-phase conductive trace may be provided in the second inner layer.

With this configuration, the first positive-electrode-side power source conductive trace, the first negative-electrode-side power source conductive trace, the first U-phase conductive trace, the first V-phase conductive trace, and the first W-phase conductive trace are disposed at positions close to the second negative-electrode-side power source conductive trace, the second positive-electrode-side power source conductive trace, the second U-phase conductive trace, the second V-phase conductive trace, and the second W-phase conductive trace so as to face the second negative-electrode-side power source conductive trace, the second positive-electrode-side power source conductive trace, the second U-phase conductive trace, the second V-phase conductive trace, and the second NV-phase conductive trace, respectively. Thus, inductances of the conductive traces can be further reduced.

A power module according to another aspect of the invention includes: a multilayer circuit board having a first principal surface and a second principal surface that is on an opposite side of the multilayer circuit board from the first principal surface; a first three-phase inverter including first U-phase upper and lower arms, first V-phase upper and lower arms, and first W-phase upper and lower arms; and a second three-phase inverter including second U-phase upper and lower arms, second V-phase upper and lower arms, and second W-phase upper and lower arms. The first three-phase inverter and the second three-phase inverter are mounted on the multilayer circuit hoard so as to be stacked each other. Where a positive-electrode-side power source conductive trace and a negative-electrode-side power source conductive trace of the first three-phase inverter are defined as a first positive-electrode-side power source conductive trace and a first negative-electrode-side power source conductive trace, respectively, and a positive-electrode-side power source conductive trace and a negative-electrode-side power source conductive trace of the second three-phase inverter are defined as a second positive-electrode-side power source conductive trace and a second negative-electrode-side power source conductive trace, respectively, the first positive-electrode-side power source conductive trace and the second positive-electrode-side power source conductive trace are disposed so as to at least partially face each other in a stacking direction of the multilayer circuit board, such that a direction in which a current flows through the first positive-electrode-side power source conductive trace and a direction in which a current flows through the second positive-electrode-side power source conductive trace are opposite to each other, in a facing section in which the first positive-electrode-side power source conductive trace and the second positive-electrode-side power source conductive trace at least partially face each other, and the first negative-electrode-side power source conductive trace and the second negative-electrode-side power source conductive trace are disposed so as to at least partially face each other in the stacking direction of the multilayer circuit hoard, such that a direction in which a current flows through the first negative-electrode-side power source conductive trace and a direction in which a current flows through the second negative-electrode-side power source conductive trace are opposite to each other, in a facing section in which the first negative-electrode-side power source conductive trace and the second negative-electrode-side power source conductive trace at least partially face each other.

With this configuration, a current flows through the first positive-electrode-side power source conductive trace in a direction opposite to the direction in which a current flows through the second positive-electrode-side power source conductive trace, in the facing section in which the first positive-electrode-side power source conductive trace and the second positive-electrode-side power source conductive trace at least partially face each other. In addition, a current flows through the first negative-electrode-side power source conductive trace in a direction opposite to the direction in which a current flows through the second negative-electrode-side power source conductive trace, in the facing section in which the first negative-electrode-side power source conductive trace and the second negative-electrode-side power source conductive trace at least partially face each other. Thus, inductances of these conductive traces are at least partially cancelled out. As a result, the inductances of the internal conductive traces are reduced. Consequently, surge voltage can be reduced.

In the power module according to the above aspect, the first U-phase upper and lower arms, the first V-phase upper and lower arms, and the first W-phase upper and lower arms may be mounted on the first principal surface of the multilayer circuit board; the second U-phase upper and lower arms, the second V-phase upper and lower arms, and the second W-phase upper and lower arms may be mounted on the second principal surface of the multilayer circuit board; at least the first positive-electrode-side power source conductive trace and the first negative-electrode-side power source conductive trace among the first positive-electrode-side power source conductive trace, the first negative-electrode-side power source conductive trace, the first U-phase conductive trace, the first V-phase conductive trace, and the first W-phase conductive trace may be provided in a first inner layer between the first principal surface and the second principal surface of the multilayer circuit board; and at least the second positive-electrode-side power source conductive trace and the second negative-electrode-side power source conductive trace among the second positive-electrode-side power source conductive trace, the second negative-electrode-side power source conductive trace, the second U-phase conductive trace, the second V-phase conductive trace, and the second W-phase conductive trace may be provided in a second inner layer between the second principal surface of the multilayer circuit board and the first inner layer.

With this configuration, the first positive-electrode-side power source conductive trace and the first negative-electrode-side power source conductive trace are disposed at positions close to the second positive-electrode-side power source conductive trace and the second negative-electrode-side power source conductive trace so as to face the second positive-electrode-side power source conductive trace and the second negative-electrode-side power source conductive trace, respectively. Thus, inductances of the conductive traces can be further reduced.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein:

FIG. 14 is a sectional view taken along line XIV-XIV in FIG. 13.

DETAILED DESCRIPTION OF EMBODIMENTS

Figure 1:
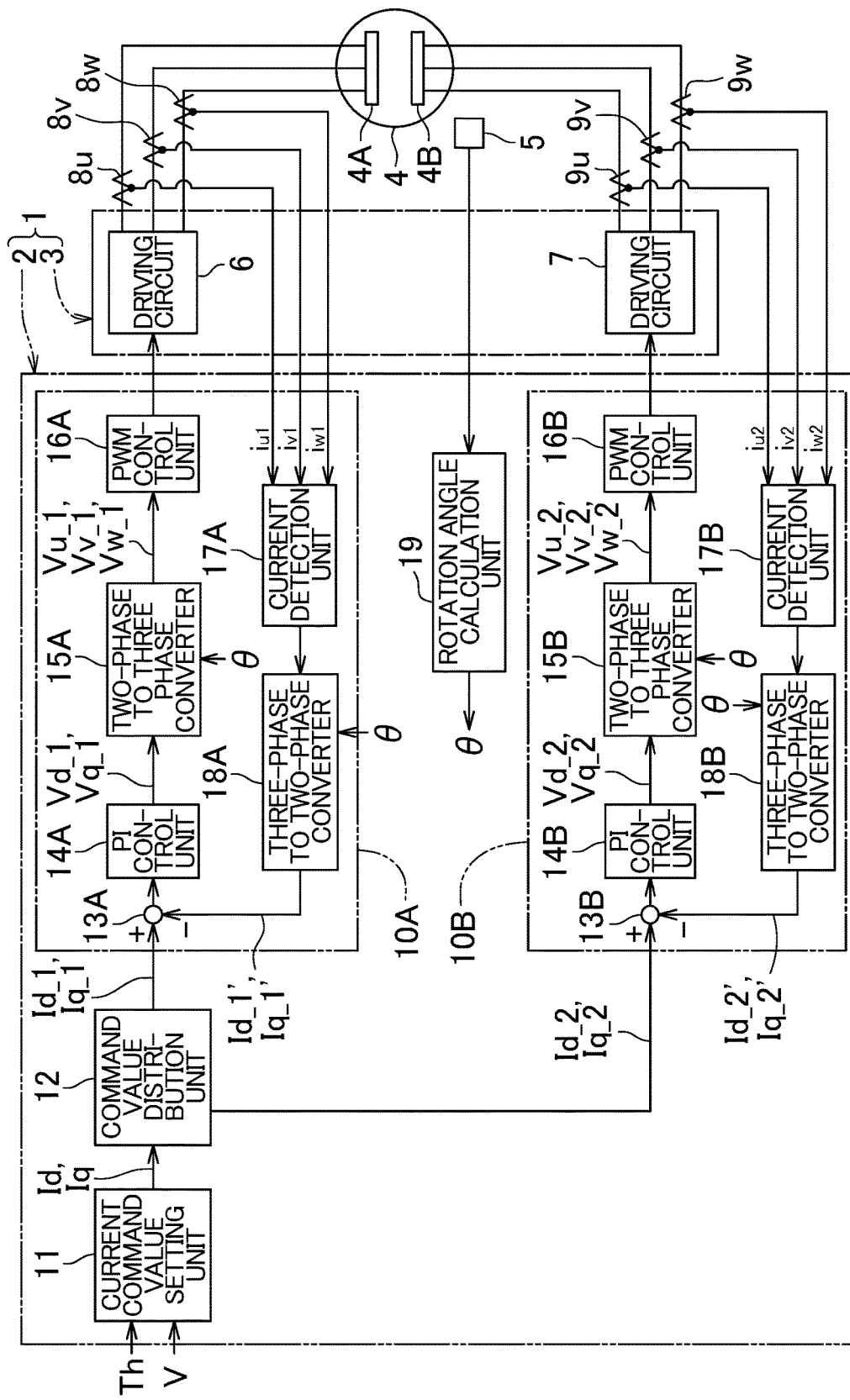
FIG. 1 is an electrical diagram illustrating a three-phase inverter circuit including a power module according to a first embodiment of the invention.

Hereinafter, example embodiments of the invention will be described in detail with reference to the accompanying drawings. FIG. 1 illustrates the configuration of a motor control circuit used in an electric power steering system, the motor control circuit including a power module according to a first embodiment of the invention. A motor control circuit 1 includes a microcomputer 2, and a power module 3 configured to supply electric power to an electric motor 4 under drive control executed by the microcomputer 2.

The electric motor 4 is a three-phase brushless motor including two sets of three-phase motor coils (three-phase stator coils) 4A, 4B. One set of the two sets of three-phase motor coils 4A, 4B provided in the electric motor 4 will be referred to as "first motor coil 4A", and the other set of the two sets of three-phase motor coils 4A, 4B provided in the electric motor 4 will be referred to as "second motor coil 4B". The first motor coil 4A includes a U-phase stator coil 4AU, a V-phase stator coil 4AV, and a W-phase stator coil 4AW (refer to FIG. 2). The second motor coil 4B includes a U-phase stator coil 4BU, a V-phase stator coil 4BV, and a W-phase stator coil 4BW (refer to FIG. 2). In the present embodiment, the U-phase stator coil 4BU, the V-phase stator coil 4BV, and the W-phase stator coil 4BW of the second motor coil 4B are respectively disposed at positions 180 degrees offset, in phase, from the U-phase stator coil 4AU, the V-phase stator coil 4AV, and the W-phase stator coil 4AW of the first motor coil 4A.

The electric motor 4 is provided with a rotation angle sensor 5 configured to detect a rotation angle of a rotor of the electric motor 4. The rotation angle sensor 5 may be, for example, a resolver. The power module 3 includes a first driving circuit 6 that is a three-phase inverter configured to supply electric power to the first motor coil 4A of the electric motor 4, and a second driving circuit 7 that is a three-phase inverter configured to supply electric power to the second motor coil 4B of the electric motor 4. Details of the power module 3 will be described later.

On electric power supply lines connecting the first driving circuit 6 and the first motor coil 4A to each other, there are provided first current sensors 8u, 8v, 8w configured to respectively detect a first U-phase current iu1, a first V-phase current iv1, and a first 4V-phase current iw1 flowing through the U-phase stator coil 4AU, the V-phase stator coil 4AV, and the W-phase stator coil 4AW of the first motor coil 4A. On electric power supply lines connecting the second driving circuit 7 and the second motor coil 4B to each other, there are provided second current sensors 9u, 9v, 9w configured to respectively detect a second U-phase current iu2, a second V-phase current iv2, and a second W-phase current iw2 flowing through the U-phase stator coil 4BU, the V-phase stator coil 4BV, and the W-phase stator coil 4BW of the second motor coil 4B.

The microcomputer 2 includes a central processing unit (CPU) and memories (e.g. a read-only memory (ROM), a random-access memory (RAM), and a nonvolatile memory). The microcomputer 2 is configured to serve as a plurality of function processing units by executing prescribed programs. The function processing units include a current command value setting unit 11, a command value distribution unit 12, a first control unit 10A configured to control driving of the first driving circuit 6, a second control unit 10B configured to control driving of the second driving circuit 7, and a rotation angle calculation unit 19.

The first control unit 10A includes a first current deviation calculation unit 13A, a first proportional integral (PI) control unit 14A, a :first two-phase to three phase converter 15A, a first pulse width modulation (PWM) control unit 16A, a first current detection unit 17A, and a first three-phase to two-phase converter 18A. The second control unit 10B includes a second current deviation calculation unit 13B, a second PI control unit 14B, a second two-phase to three phase converter 15B, a second PWM control unit 16B, a second current detection unit 17B, and a second three-phase to two-phase converter 18B.

The rotation angle calculation unit 19 calculates a rotation angle θ (electrical angle) of the rotor (hereinafter, referred to as "rotor rotation angle θ" where appropriate) of the electric motor 4 based on an output signal from the rotation angle sensor 5. The rotation angle θ calculated by the rotation angle calculation unit 19 is provided to the first and second two-phase to three phase converters 15A, 15B, and the first and second three-phase to two-phase converters 18A, 18B. The current command value setting unit 11 sets values of currents to be passed through coordinate axes of a dq-coordinate system as current command values (basic current command values), based on a steering torque Th detected by a torque sensor (not illustrated), and a vehicle speed V detected by a vehicle speed sensor (not illustrated). Specifically, the current command value setting unit 11 calculates a d-axis current command value Id and a q-axis current command value Iq (hereinafter, collectively referred to as "two-phase current command value Idq" where appropriate). More specifically, the current command value setting unit 11 calculates a target torque Tm by multiplying the steering torque Th by a vehicle speed gain Gv (Gv>0) that have a smaller value as the vehicle speed V increases. Then, the current command value setting unit 11 calculates the q-axis current command value Iq by dividing the target torque Tm by a torque constant Kt of the electric motor 4. The current command value setting unit 11 sets the d-axis current command value Id to zero, for example.

The command value distribution unit 12 distributes the two-phase current command value Idq to the first control unit 10A and the second control unit 10B. In the present embodiment, the command value distribution unit 12 distributes half of the two-phase current command value Idq to each of the first control unit 10A and the second control unit 10B. That is, each of a distribution factor of the two-phase current command value Idq for the first control unit 10A and a distribution factor of the two-phase current command value Idq for the second control unit 10B is 50%. Because the second motor coil 4B is 180 degrees offset, in phase, from the first motor coil 4A, a current command value to be distributed to the second control unit 10B has an inverted sign. Thus, the current command value to be distributed to the second control unit 10B is inverted in sign (plus/minus sign) from the current command value to be distributed to the first control unit 10A.

The two-phase current command value to be distributed to the first control unit 10A will be referred to as "first two-phase current command value Idq_1". The first two-phase current command value Idq_1 includes a first d-axis current command value Id_1 and a first q-axis current command value Iq_1. The two-phase current command value to be distributed to the second control unit 10B will be referred to as "second two-phase current command value Idq_2". The second two-phase current command value Idq_2 includes a second d-axis current command value Id_2 and a second q-axis current command value Iq_2.

First, the first control unit 10A will be described. The first current detection unit 17A detects the first U-phase current iu1, the first V-phase current iv1, and the first 4V-phase current iw1, based on the outputs from the first current sensors 8u, 8v, 8w. The first three-phase to two-phase converter 18A executes coordinate transformation to convert the first U-phase current iu1, the first V-phase current iv1, and the first W-phase current iw1, which are detected by the first current detection unit 17A, into a first d-axis detected current Id_1' and a first q-axis detected current Iq_1', which correspond to a two-phase detected current of the dq-coordinate system. The coordinate transformation is executed based on the rotor rotation angle θ calculated by the rotation angle calculation unit 19.

The first current deviation calculation unit 13A calculates deviations between the two-phase current command values Id_1, Iq_1, which are distributed to the first control unit 10A by the command value distribution unit 12, and the two-phase detected currents Id_1', Iq_1', provided from the first three-phase to two-phase converter 18A. Specifically, the first current deviation calculation unit 13A calculates a deviation of the first d-axis detected current Id_1' from the first d-axis current command value Id_1, and a deviation of the first q-axis detected current Iq_1' from the first q-axis current command value Iq_1.

The first PI control unit 14A executes PI calculation on the current deviation calculated by the first current deviation calculation unit 13A to create a first two-phase voltage command value (i.e., a first d-axis voltage command value Vd_1 and a first q-axis voltage command value Vq_1) to be applied to the first motor coil 4A. The first two-phase to three phase converter 15A executes coordinate transformation to convert the first d-axis voltage command value Vd_1 and the first q-axis voltage command value Vq_1, which are provided from the first PI control unit 14A, into a first three-phase voltage command value Vuvw_1. The coordinate transformation is executed based on the rotor rotation angle θ calculated by the rotation angle calculation unit 19. The first three-phase voltage command value Vuvw_1 includes a first U-phase voltage command value Vu_1, a first V-phase voltage command value Vv_1, and a first W-phase voltage command value Vw_1.

The first PWM control unit 16A creates a U-phase PWM signal, a V-phase PWM signal, and a W-phase PWM signal having duty ratios respectively corresponding to the first U-phase voltage command value Vu_1, the first V-phase voltage command value Vv_1, and the first W-phase voltage command value Vw_1, and supplies the U-phase PWM signal, the V-phase PWM signal, and the W-phase PWM signal to the first driving circuit 6. The first driving circuit 6 is an inverter with three phases corresponding to a U-phase, a V-phase, and a W-phase. A voltage corresponding to the first three-phase voltage command value Vuvw_1 is applied to the U-phase stator coil 4AU, the V-phase stator coil 4AV and the W-phase stator coil 4AW of the first motor coil 4A of the electric motor 4, by controlling power elements (switching devices) constituting the inverter according to the PWM signals provided from the first PWM control unit 16A. Thus, a motor current flowing through the first motor coil 4A is controlled so as to approach the first current command value Idq_1 distributed to the first control unit 10A by the command value distribution unit 12

Subsequently, the second control unit 10B will be described. The second current detection unit 17B detects the second U-phase current iu2, the second V-phase current iv2, and the second W-phase current iw2, based on the outputs from the second current sensors 9u, 9v, 9w. The second three-phase to two-phase converter 18B executes coordinate transformation to convert the second U-phase current iu2, the second V-phase current iv2, and the second W-phase current iw2, which are detected by the second current detection unit 17B, into a second d-axis detected current Id_2' and a second q-axis detected current Iq_2', which correspond to a two-phase detected current of the dq-coordinate system. The coordinate transformation is executed based on the rotor rotation angle θ calculated by the rotation angle calculation unit 19.

The second current deviation calculation unit 13B calculates deviations between the two-phase current command values Id_2, Iq_2, which are distributed to the second control unit 10B by the command value distribution unit 12, and the two-phase detected currents Id_2', Iq_2', provided from the second three-phase to two-phase converter 18B. Specifically, the second current deviation calculation unit 13B calculates a deviation of the second d-axis detected current Id_2' from the second d-axis current command value Id_2, and a deviation of the second q-axis detected current Iq_2' from the second q-axis current command value Iq_2.

The second PI control unit 14B executes PI calculation on the current deviation calculated by the second current deviation calculation unit 13B to create a second two-phase voltage command value (i.e., a second d-axis voltage command value Vd_2 and a second q-axis voltage command value Vq_2) to be applied to the second motor coil 4B. The second two-phase to three phase converter 15B executes coordinate transformation to convert the second d-axis voltage command value Vd_2 and the second q-axis voltage command value Vq_2, which are provided from the second PI control unit 14B, into a second three-phase voltage command value Vuvw_2. The coordinate transformation is executed based on the rotor rotation angle θ calculated by the rotation angle calculation unit 19. The second three-phase voltage command value Vuvw_2 includes a second U-phase voltage command value Vu_2, a second V-phase voltage command value Vv_2, and a second W-phase voltage command value Vw_2.

The second PWM control unit 16B creates a U-phase PWM signal, a V-phase PWM signal, and a W-phase PWM signal having duty ratios respectively corresponding to the second U-phase voltage command value Vu_2, the second V-phase voltage command value Vv_2, and the second W-phase voltage command value Vw_2, and supplies the U-phase PWM signal, the V-phase PWM signal, and the W-phase PWM signal to the second driving circuit 7. The second driving circuit 7 is an inverter with three phases corresponding to a U-phase, a V-phase, and a W-phase. A voltage corresponding to the second three-phase voltage command value Vuvw_2 is applied to the U-phase stator coil 4BU, the V-phase stator coil 4BV, and the W-phase stator coil 4BW of the second motor coil 4B of the electric motor 4, by controlling power elements (switching devices) constituting the inverter according to the PWM signals provided from the second PWM control unit 16B. Thus, a motor current flowing through the second motor coil 49 is controlled so as to approach the second current command value Idq_2 distributed to the second control unit 109 by the command value distribution unit 12.

Figure 2:
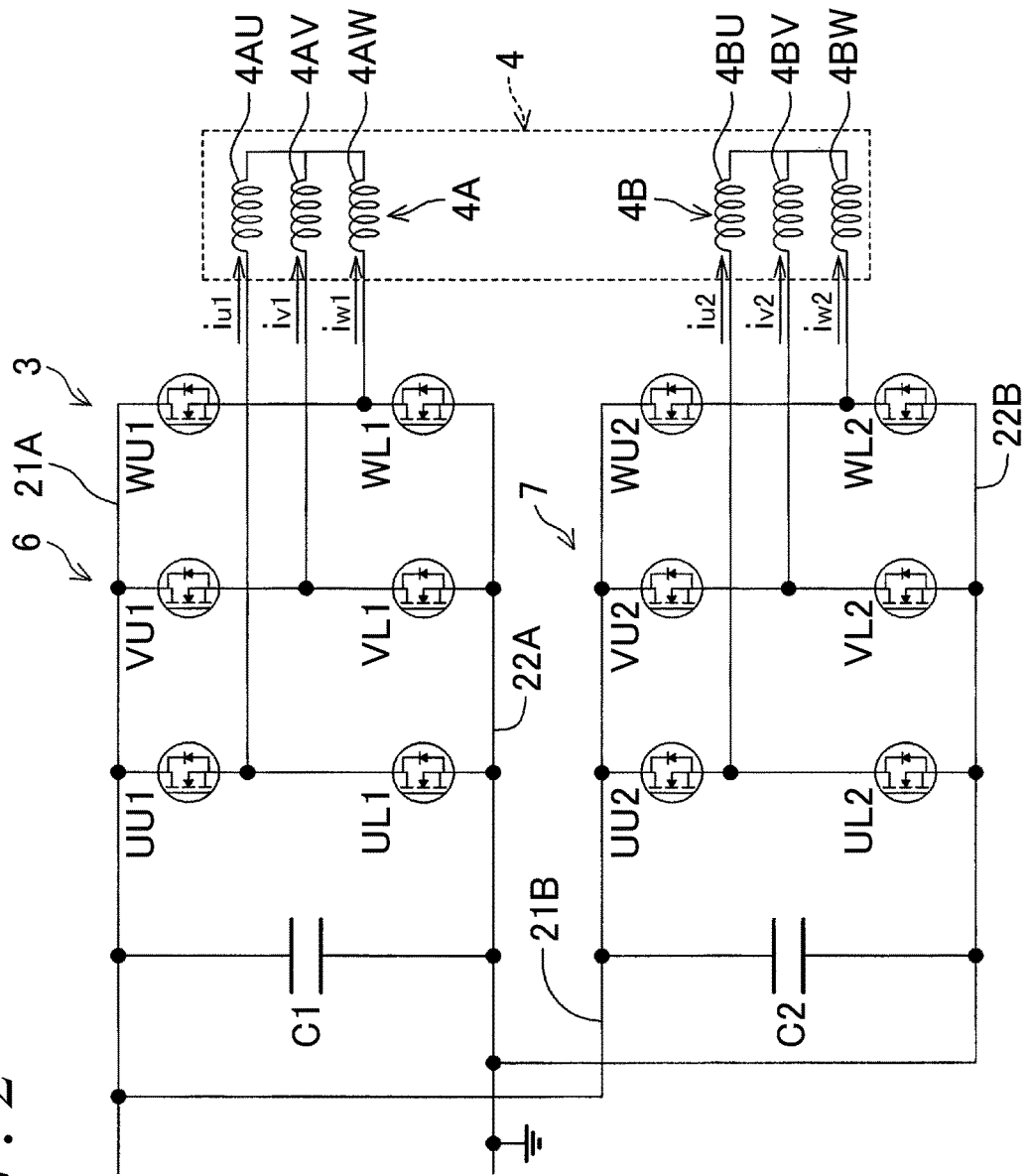
FIG. 2 is a circuit diagram illustrating the electrical configuration of the power module.

FIG. 2 is a circuit diagram illustrating the electrical configuration of the power module 3. The power module 3 includes the first driving circuit 6 and the second driving circuit 7. The first driving circuit 6 includes a first positive-electrode-side power supply line 21A connected to a positive-electrode terminal of a direct-current (DC) power source (not illustrated), a first negative-electrode-side power supply line (GND line) 22A connected to a negative-electrode terminal of the DC power source, and a first smoothing capacitor C1, a first U-phase circuit, a first V-phase circuit, and a first W-phase circuit, which are connected in parallel with each other between the first positive-electrode-side power supply line 21A and the first negative-electrode-side power supply line 22A.

The first U-phase circuit is a series circuit including a first switching device (first U-phase upper arm) UU1 on a U-phase high side, and a first switching device (first U-phase lower arm) UL1 on a U-phase low side, which is connected in series to the first switching device UU1. The first V-phase circuit is a series circuit including a first switching device (first V-phase upper arm) VU1 on a V-phase high side, and a first switching device (first V-phase lower arm) VL1 on a V-phase low side, which is connected in series to the first switching device VU1 The first W-phase circuit is a series circuit including a first switching device (first W-phase upper arm) WU1 on a W-phase high side, arid a first switching device (first W-phase lower arm) WL1 on a W-phase low side, which is connected in series to the first switching device WU1. In the present embodiment, each of the first switching devices UU1 to WL1 is a metal-oxide-semiconductor field-effect transistor (MOSFET) of an n-channel type.

Each of the first switching devices UU1 to WL1 includes a built-in PN junction diode (body diode). An anode of each of the PN junction diodes is electrically connected to a source of the corresponding one of the first switching devices UU1 to WL1, and a cathode thereof is electrically connected to a drain of the corresponding one of the first switching devices UU1 to WL1. In the first U-phase circuit, the first V-phase circuit, and the first W-phase circuit, drain electrodes of the first switching devices (first upper arms) UU1, VU1, WU1, which are on the high side, are connected to the first positive-electrode-side power supply line 21A. In the first U-phase circuit, the first V-phase circuit, and the first W-phase circuit, source electrodes of the first switching devices UU1, VU1, WU1, which are on the high side, are connected to drain electrodes of the first switching devices (first lower arms) UL1, VL1, WL1, which are on the low side. In the first U-phase circuit, the first V-phase circuit, and the first W-phase circuit, source electrodes of the first switching devices UL1, VL1, WL1, which are on the low side, are connected to the first negative-electrode-side power supply line 22A.

A connecting point between the first switching device UU1 on the U-phase high side and the first switching device UL1 on the U-phase low side, is connected to the U-phase stator coil 4AU of the first motor coil 4A through the internal conductive trace and external conductive trace of the power module 3. A connecting point between the first switching device VU1 on the V-phase high side and the first switching device VL1 on the V-phase low side, is connected to the V-phase stator coil 4AV of the first motor coil 4A through the internal conductive trace and external conductive trace of the power module 3. A connecting point between the first switching device WU1 on the W-phase high side and the first switching device WL1 on the W-phase low side, is connected to the W-phase stator coil 4AW of the first motor coil 4A through the internal conductive trace and external conductive trace of the power module 3.

The second driving circuit 7 includes a second positive-electrode-side power supply line 21B connected to the first positive-electrode-side power supply line 21A, a second negative-electrode-side power supply line (GND line) 22B connected to the first negative-electrode-side power supply line 22A, and a second smoothing capacitor C2, a second U-phase circuit, a second V-phase circuit, and a second W-phase circuit, which are connected in parallel with each other between the second positive-electrode-side power supply line 21B and the second negative-electrode-side power supply line 22B.

The second U-phase circuit is a series circuit including a second switching device (second U-phase upper arm) UU2 on the U-phase high side, and a second switching device (second U-phase lower arm) UL2 on the U-phase low side, which is connected in series to the second switching device UU2. The second V-phase circuit is a series circuit including a second switching device (second V-phase upper arm) VU2 on the V-phase high side, and a second switching device (second V-phase lower arm) VL2 on the V-phase low side, which is connected in series to the second switching device VU2. The second W-phase circuit is a series circuit including a second switching device (second W-phase upper arm) WU2 on the W-phase high side, and a second switching device (second W-phase lower arm) WL2 on the W-phase low side, which is connected in series to the second switching device WU2. In the present embodiment, each of the second switching devices UU2 to WL2 is a MOSFET of an n-channel type.

Each of the second switching devices UU2 to WL2 includes a built-in PN junction diode (body diode). An anode of each of the PN junction diodes is electrically connected to a source of the corresponding one of the second switching devices UU2 to WL2, and a cathode thereof is electrically connected to a drain of the corresponding one of the second switching devices UU2 to WL2. In the second U-phase circuit, the second V-phase circuit, and the second W-phase circuit, drain electrodes of the second switching devices UU2, VU2, WU2, which are on the high side, are connected to the second positive-electrode-side power supply line 21B. In the second U-phase circuit, the second V-phase circuit, and the second W-phase circuit, source electrodes of the second switching devices UU2, VU2, WU2, which are on the high side, are connected to drain electrodes of the second switching devices UL2, VL2, WL2, which are on the low side. In the second U-phase circuit, the second V-phase circuit, and the second W-phase circuit, source electrodes of the second switching devices UL2, VL2, WL2, which are on the low side, are connected to the second negative-electrode-side power supply line 22B.

A connecting point between the second switching device UU2 on the U-phase high side and the second switching device UL2 on the U-phase low side, is connected to the U-phase stator coil 4BU of the second motor coil 4B through the internal conductive trace and external conductive trace of the power module 3. A connecting point between the second switching device VU2 on the V-phase high side and the second switching device VL2 on the V-phase low side, is connected to the V-phase stator coil 4BV of the second motor coil 4B through the internal conductive trace and external conductive trace of the power module 3. A connecting point between the second switching device WU2 on the W-phase high side and the second switching device WL2 on the 4V-phase low side, is connected to the W-phase stator coil 4BW of the second motor coil 4B through the internal conductive trace and external conductive trace of the power module 3.

Figure 3A:
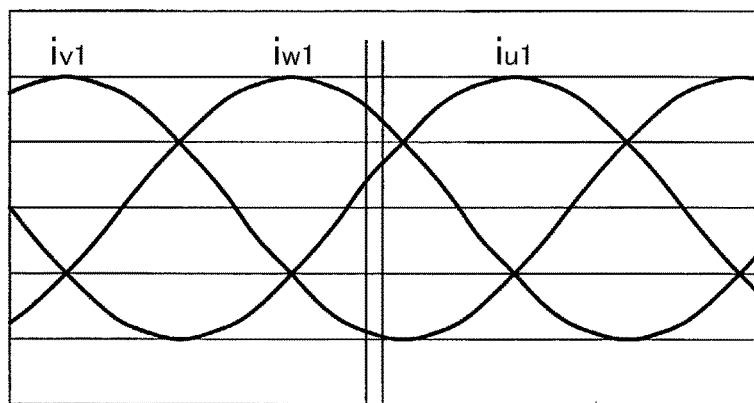
FIG. 3A is a time-series chart illustrating an example of variation in first phase currents iu1, iv1, iw1 flowing through a first motor coil.
Figure 3B:
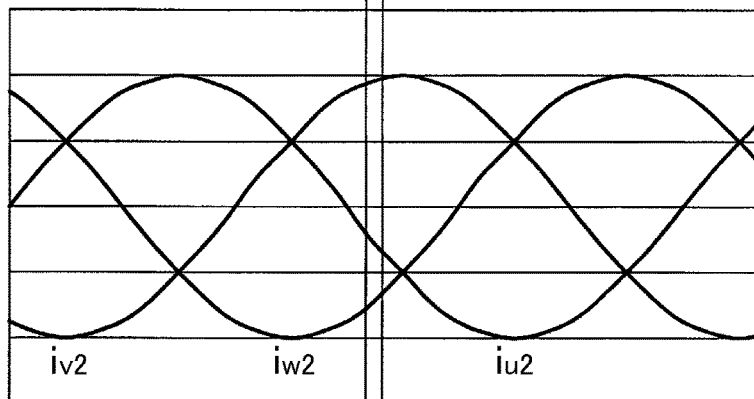
FIG. 3B is a time-series chart illustrating an example of variation in second phase currents iu2, iv2, iw2 flowing through a second motor coil.

FIG. 3A is a time-series chart illustrating an example of variation in each of the first phase currents iu1, iv1, iw1 flowing through the first motor coil 4A. FIG. 3B is a time-series chart illustrating an example of variation in each of the second phase currents iu2, iv2, iw2 flowing through the second motor coil 4B. As can be seen from FIG. 3A and FIG. 3B, the second phase currents iu2, iv2, iw2, flowing through the second motor coil 4B, are respectively 180 degrees offset, in phase, from the first phase currents iu1, iv1, iw1, flowing through the first motor coil 4A. This is because a current command value for the second control unit 10B is inverted in sign with respect to a current command value for the first control unit 10A as described above, and a waveform of a PWM carrier signal used in the first control unit 10A and a waveform of a PWM carrier signal used in the second control unit 10B are made different from each other as described later.

Figure 4A:
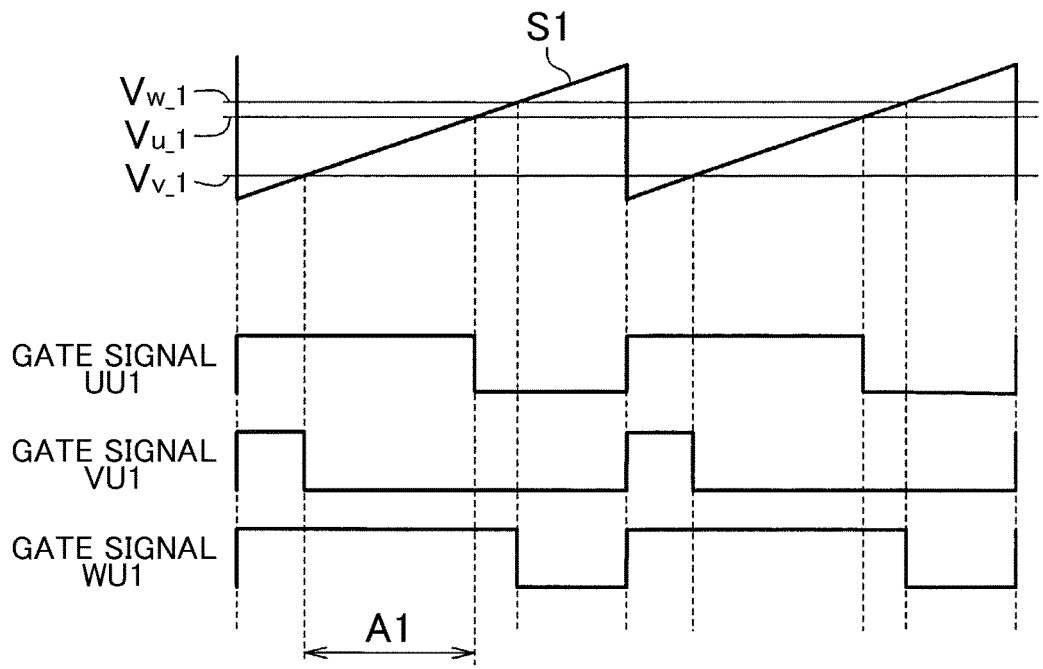
FIG. 4A is a time-series chart Illustrating gate signals for a first driving circuit in a period A in FIG. 3A and FIG. 3B.

FIG. 4A is a time-series chart illustrating gate signals for the first driving circuit 6 in a period A in FIG. 3A and FIG. 3B. In FIG. 4A, reference symbols Vu_1, Vv_1, Vw_1 respectively denote the first U-phase voltage command value Vu_1, the first V-phase voltage command value Vv_1, and the first W-phase voltage command value Vw_1, which are output from the first two-phase to three phase converter 15A in FIG. 1. In FIG. 4A, a UU1 gate signal, a VU1 gate signal, and a WU1 gate signal respectively denote gate signals for the first switching devices UU1, VU1, WU1, which are on the high side in the first driving circuit 6. The UU1 gate signal, the VU1 gate signal, and the WU1 gate signal are created based on a first carrier signal S1 with a sawtooth wave in which a value gradually increases and then rapidly decreases, and the first U-phase voltage command value Vu_1, the first V-phase voltage command value Vv_1, and the first W-phase voltage command value Vw_1.

Figure 4B:
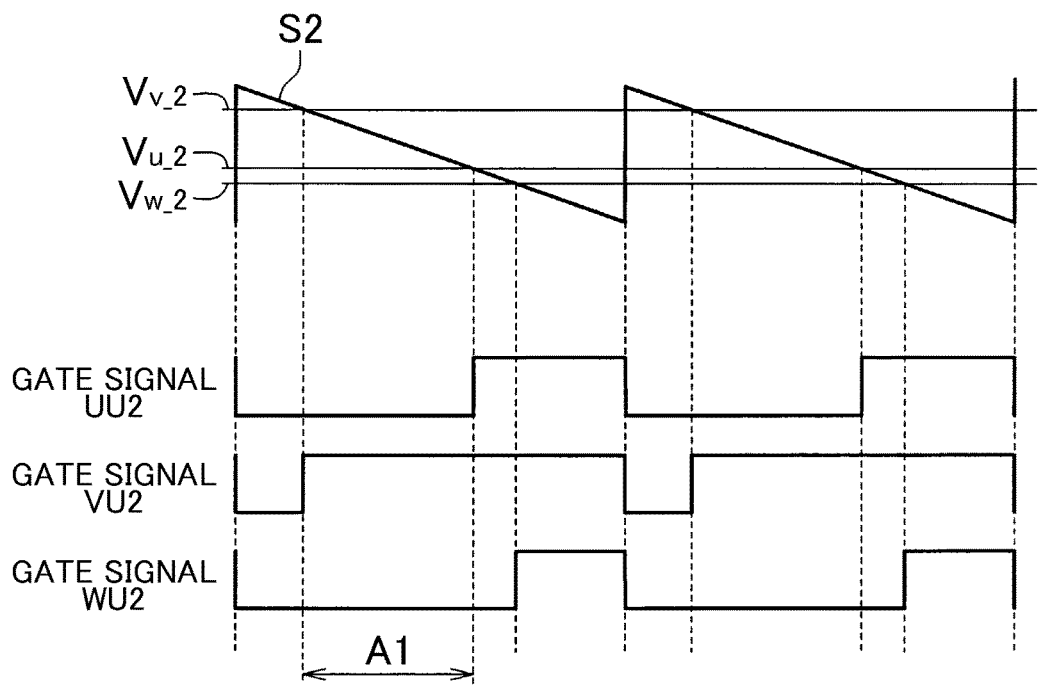
FIG. 4B is a time-series chart illustrating gate signals for a second driving circuit in the period A in FIG. 3A and FIG. 3B.

FIG. 4B is a time-series chart illustrating gate signals for the second driving circuit 7 in the period A in FIG. 3A and FIG. 3B. In FIG. 4B, reference symbols Vu_2, Vv_2, Vw_2 respectively, denote the second U-phase voltage command value Vu_2, the second V-phase voltage command value Vv_2, and the second W-phase voltage command value Vw_2, which are output from the second two-phase to three phase converter 15B in FIG. 1. In FIG. 4B, a UU2 gate signal, a VU2 gate signal, and a WU2 gate signal respectively denote gate signals for the second switching devices UU2, VU2, WU2, which are on the high side in the second driving circuit 7. The UU2 gate signal, the VU2 gate signal, and the WU2 gate signal are created based on a second carrier signal S2 with a sawtooth Wave in which a value gradually decreases and then rapidly increases, and the second U-phase voltage command value Vu_2, the second V-phase voltage command value Vv_2, and the second W-phase voltage command value Vw_2. The sawtooth wave of the second carrier signal S2 is opposite in orientation to the sawtooth wave of the first carrier signal S1 in the time axis.

Figure 5:
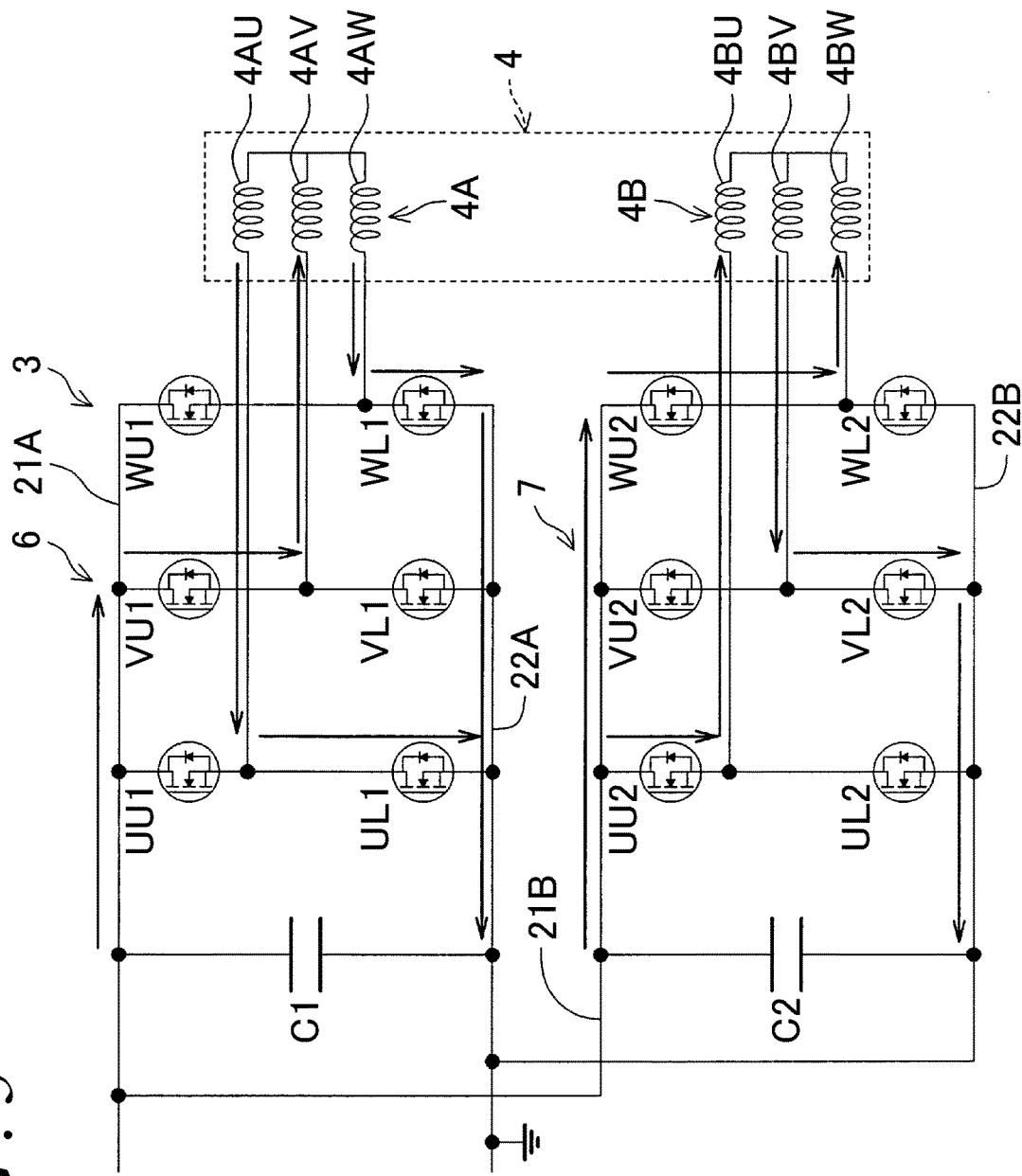
FIG. 5 is a circuit diagram illustrating directions of currents flowing through the first driving circuit 6 and the second driving circuit 7 in a period A1 in FIG. 4A and FIG. 4B.

FIG. 5 is a circuit diagram illustrating the directions of currents flowing through the first driving circuit 6 and the second driving circuit 7 in the period A1 illustrated in FIG. 4A and FIG. 4B. As described above, a current command value for the second control unit 10B is inverted in sign with respect to a current command value for the first control unit 10A, and the sawtooth wave of the second carrier signal S2 is opposite in orientation to the sawtooth wave of the first carrier signal S1 in the time axis. As a result, in each of the U-phase circuit, the V-phase circuit, and the W-phase circuit, when the switching device (upper arm) on the high side is in an on-state in the first driving circuit 6, the switching device (lower arm) on the low side is in an on-state in the second driving circuit 7, whereas when the switching device (upper arm) on the high side is in an on-state in the second driving circuit 7, the switching device (lower arm) on the low side is in an on-state in the first driving circuit 6.

In an example in FIG. 5, regarding the U-phase circuit, the switching device UL1 on the low side is in an on-state in the first driving circuit 6, and the switching device UU2 on the high side is in an on-state in the second driving circuit 7. Regarding the V-phase circuit, the switching device VU1 on the high side is in an on-state in the first driving circuit 6, and the switching device VL2 on the low side is in an on-state in the second driving circuit 7. Regarding the W-phase circuit, the switching device WL1 on the low side is in an in-state in the first driving circuit 6, the switching device WU2 on the high side is in an on-state in the second driving circuit 7.

Figure 6:
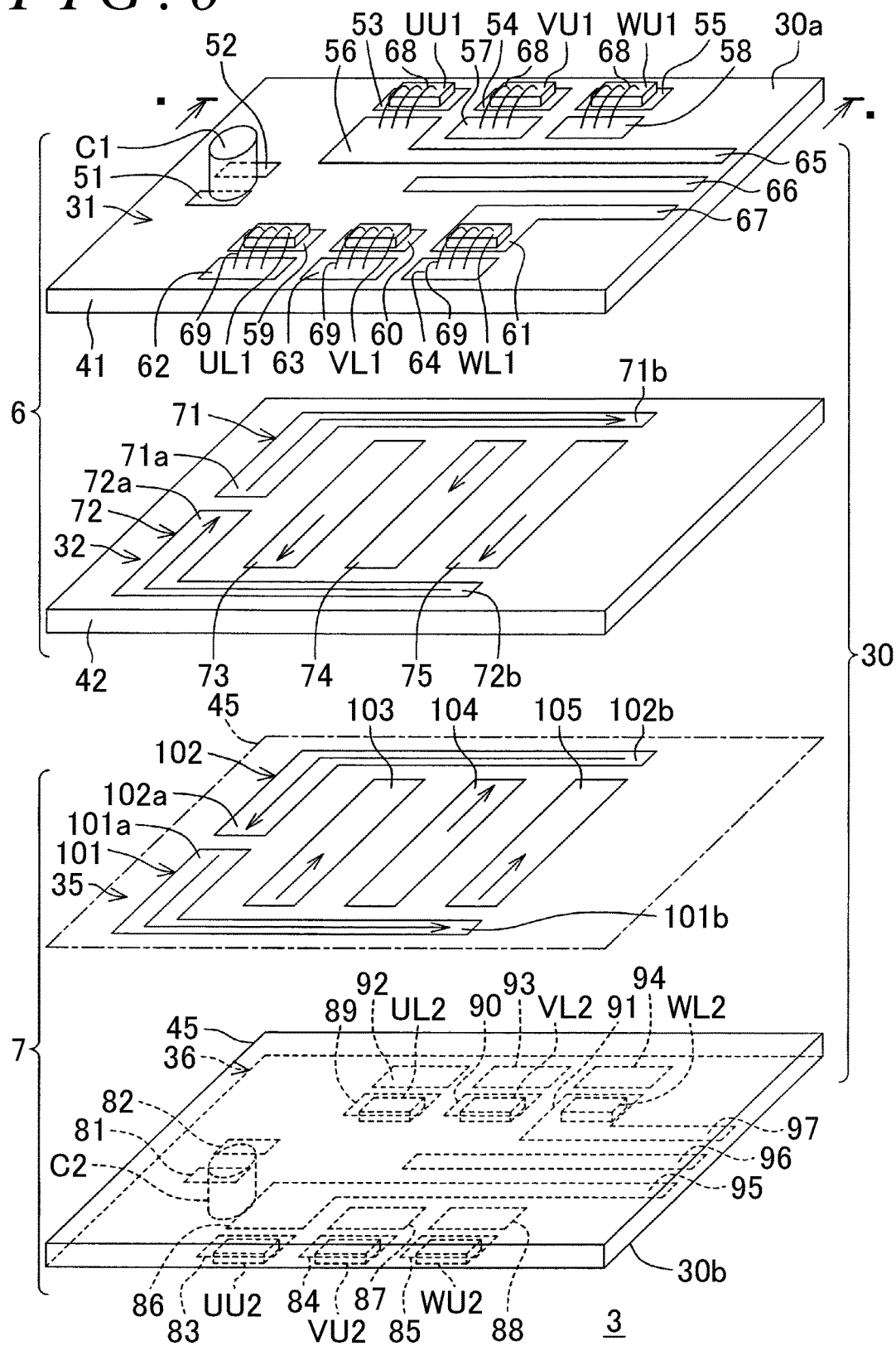
FIG. 6 is an exploded perspective view illustrating the configuration of the power module.
Figure 7:
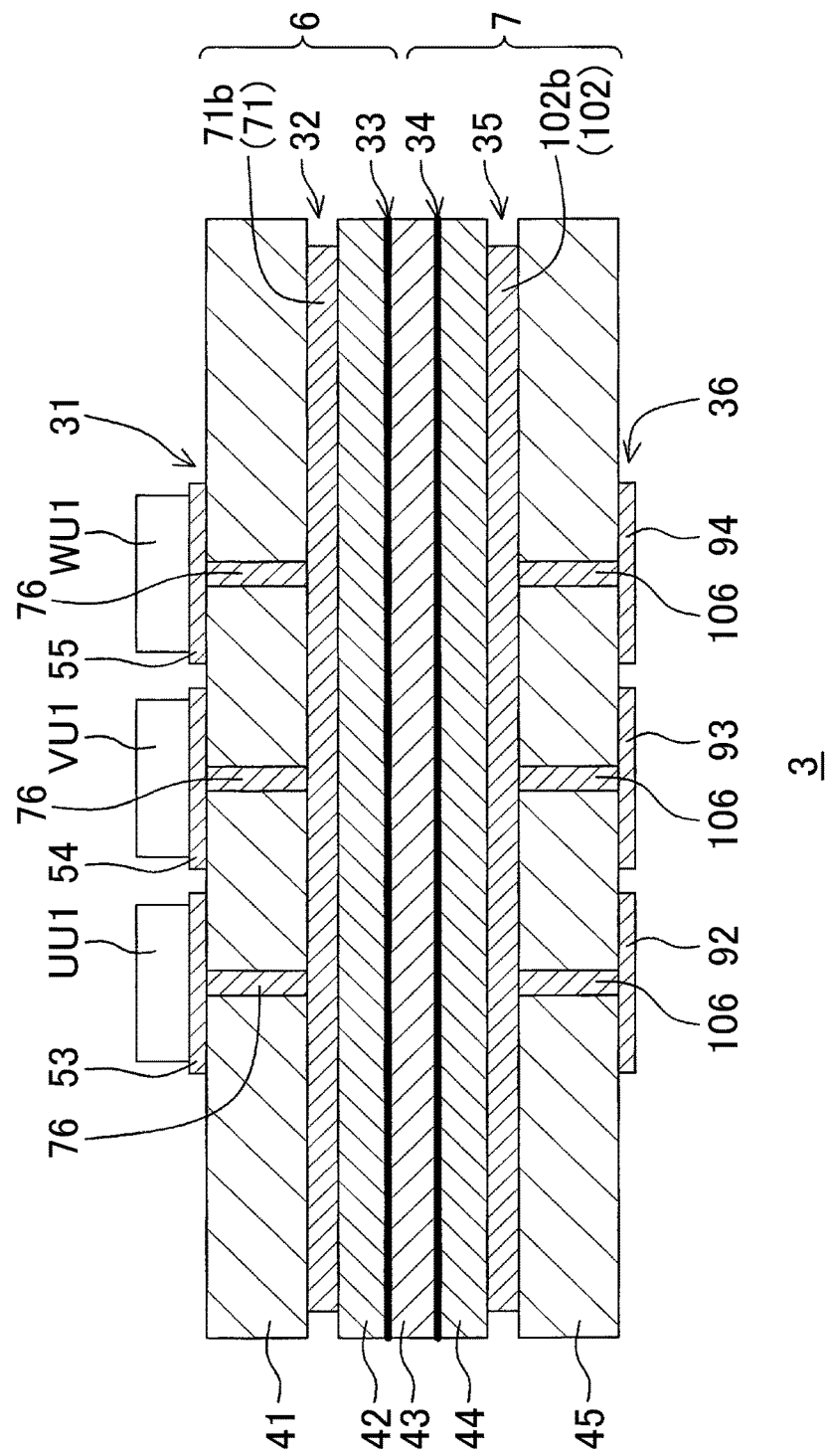
FIG. 7 is a sectional view taken along line VII-VII in FIG. 6.

FIG. 6 is an exploded perspective view illustrating the configuration of the power module 3. FIG. 7 is a sectional view taken along line VII-VII in FIG. 6. In the description below, "left" denotes the left side in FIG. 6, "right" denotes the right side in FIG. 6, "front" denotes the front side in FIG. 6, and "back" denotes the back side in FIG. 6. In addition, "upper" denotes the upper side in FIG. 7, and "lower" denotes the lower side in FIG. 7.

The power module 3 includes a multilayer circuit board 30 having a rectangular shape in a plan view. The multilayer circuit board 30 has a multilayer structure including a first conductive layer (surface-layer conductive trace) 31, a second conductive layer (inner layer conductive trace) 32, a third conductive layer (inner layer conductive trace) 33, a fourth conductive layer (inner layer conductive trace) 34, a fifth conductive layer (inner layer conductive trace) 35, a sixth conductive layer (back layer conductive trace) 36, and insulation layers 41, 42, 43, 44, 45 provided between the conductive layers. The layers are bonded together through thermocompression bonding. In FIG. 6, the third conductive layer 33, the fourth conductive layer 34, the insulation layer 43, and the insulation layer 44 are omitted for convenience of description.

The first smoothing capacitor C1 and the first switching devices UU1 to WL1, which constitute the first driving circuit 6, are mounted on a surface 30a (a first principal surface, an upper surface in FIG. 6) of the multilayer circuit board 30. The surface 30a is a surface on the first conductive layer 31-side. The first smoothing capacitor C1 is disposed in a central portion in the front-back direction, in a left portion of the surface 30a of the multilayer circuit board 30, in a plan view. The first switching devices UU1, VU1, WU1, which are respectively on the U-phase high side, the V-phase high side, and the W-phase high side, are disposed at positions close to the rear long side of the surface 30a of the multilayer circuit board 30 so as to be arranged in this order from the left at intervals in the right-left direction, in a plan view. The first switching devices UL1, VL1, WL1, which are respectively on the U-phase low side, the V-phase low side, and the W-phase low side, are disposed at positions close to the front long side of the surface 30a of the multilayer circuit board 30 so as to be arranged in this order from the left at intervals in the right-left direction, in a plan view.

The second smoothing capacitor C2 and the second switching devices UU2 to WL2, which constitute the second driving circuit 7, are mounted on a surface 30b (a back surface, a second principal surface, a lower surface in FIG.

6) of the multilayer circuit board 30. The surface 30b is a surface on the sixth conductive layer 36-side. The second smoothing capacitor C2 is disposed in a central portion in the front-back direction, in a left portion of the back surface 30b of the multilayer circuit board 30, in a plan view. The second switching devices UU2, VU2, WU2, which are respectively on the U-phase high side, the V-phase high side, and the W-phase high side, are disposed at positions close to the front long side of the back surface 30b of the multilayer circuit board 30 so as to be arranged in this order from the left at intervals in the right-left direction, in a plan view. The second switching devices UL2, VL2, WL2, which are respectively on the U-phase low side, the V-phase low side, and the W-phase low side, are disposed at positions close to the rear long side of the back surface 30b of the multilayer circuit board 30 so as to be arranged in this order from the left at intervals in the right-left direction, in a plan view.

Each of the switching devices UU1 to WL1 and UU2 to WL2 is a vertical switching device having a drain electrode on one surface thereof and having a source electrode and a gate electrode on an opposite surface thereof. The first conductive layer 31, the second conductive layer 32, and the third conductive layer 33 constitute lands, conductive traces, and so forth for the first driving circuit 6. The fourth conductive layer 34, the fifth conductive layer 35, and the sixth conductive layer 36 constitute lands, conductive traces, and so forth for the second driving circuit 7.

The first conductive layer 31 includes a plurality of lands and a plurality of conductive traces, which are provided on an upper surface of the insulation layer 41. The lands include a pair of capacitor lands 51, 52, a drain land 53 for the U-phase high side, a drain land 54 for the V-phase high side, a drain land 55 for the W-phase high side, a source land 56 for the U-phase high side, a source land 57 for the V-phase high side, and a source land 58 for the W-phase high side. The lands further include a drain land 59 for the U-phase low side, a drain land 60 for the V-phase low side, a drain land 61 for the W-phase low side, a source land 62 for the U-phase low side, a source land 63 for the V-phase low side, and a source land 64 for the W-phase low side. The conductive traces include a U-phase output conductive trace 65, a V-phase output conductive trace 66, and a W-phase output conductive trace 67. While the first conductive layer 31 includes six gate lands to which the gate electrodes of the first switching devices UU1 to WL1 are connected by metal wires, illustrations thereof are omitted for convenience of description.

The capacitor lands 51, 52 are disposed in the central portion in the left portion of the upper surface of the insulation layer 41 so as to be apart from each other in the front-back direction. The first smoothing capacitor C1 has a pair of electrodes. The electrodes of the first smoothing capacitor C1 are joined to the capacitor lands 51, 52. The drain land 53 for the U-phase high side, the drain land 54 for the V-phase high side, and the drain land 55 for the W-phase high side are disposed in a region close to the hack end of the upper surface of the insulation layer 41 so as to be arranged in this order from the left at intervals in the right-left direction. Drain electrodes of the switching device UU1 on the U-phase high side, the switching device VU1 on the V-phase high side, and the switching device WU1 on the W-phase high side are respectively joined to the drain land 53 for the U-phase high side, the drain land 54 for the V-phase high side, and the drain land 55 for the W-phase high side.

The source land 56 for the U-phase high side, the source land 57 for the V-phase high side, and the source land 58 for the W-phase high side are respectively disposed on the front sides of the drain land 53 for the U-phase high side, the drain land 54 for the V-phase high side, and the drain land 55 for the W-phase high side. Source electrodes of the switching device UU1 on the U-phase high side, the switching device VU1 on the V-phase high side, and the switching device WU1 on the W-phase high side are respectively connected to the source land 56 for the U-phase high side, the source land 57 for the V-phase high side, and the source land 58 for the W-phase high side, through metal wires 68.

The drain land 59 for the U-phase low side, the drain land 60 for the V-phase low side, and the drain land 61 for the W-phase low side are disposed in a region close to the front end of the upper surface of the insulation layer 41 so as to be arranged in this order from the left at intervals in the right-left direction. The drain land 59 for the U-phase low side, the drain land 60 for the V-phase low side, and the drain land 61 for the W-phase low side are respectably aligned with the drain land 53 for the U-phase high side, the drain land 54 for the V-phase high side, and the drain land 55 for the W-phase high side in the front-back direction. Drain electrodes of the switching device UL1 on the U-phase low side, the switching device VL1 on the V-phase low side, and the switching device WU on the W-phase low side are respectively joined to the drain land 59 for the U-phase low side, the drain land 60 for the V-phase low side, and the drain land 61 for the W-phase low side.

The source land 62 for the U-phase low side, the source land 63 for the V-phase low side, and the source land 64 for the W-phase low side are respectively disposed on the front sides of the drain land 59 for the U-phase low side, the drain land 60 for the V-phase low side, and the drain land 61 for the W-phase low side Source electrodes of the switching device UL1 on the U-phase low side, the switching device VL1 on the V-phase low side, and the switching device WL1 on the W-phase low side are respectively connected to the source land 62 for the U-phase low side, the source land 63 for the V-phase low side, and the source land 64 for the W-phase low side, through metal wires 69.

The U-phase output conductive trace 65 is integrally connected at its left end portion to a front end portion of the source land 56 for the U-phase high side, and linearly extends rightward from the left end portion. The U-phase output conductive trace 65 has a right end portion serving as a first U-phase output terminal. The W-phase output conductive trace 67 is integrally connected at its left end portion to a back end portion of the drain land 61 for the W-phase low side, and linearly extends rightward from the left end portion. The W-phase output conductive trace 67 has a right end portion serving as a first W-phase output terminal. The V-phase output conductive trace 66 linearly extends rightward from a position between the source land 57 for the V-phase high side and the drain land 60 for the V-phase low side so as to pass through a region between the U-phase output conductive trace 65 and the W-phase output conductive trace 67. The V-phase output conductive trace 66 has a right end portion serving as a first V-phase output terminal.

The second conductive layer 32 includes a plurality conductive traces, which are provided on an upper surface of the insulation layer 42. The conductive traces include a first positive-electrode-side power source conductive trace 71 constituting the first positive-electrode-side power supply line 21A, a first negative-electrode-side power source conductive trace 72 constituting the first negative-electrode-side power supply line 22A, a first U-phase conductive trace 73, a first V-phase conductive trace 74, and a first W-phase conductive trace 75. The first positive-electrode-side power source conductive trace 71 includes a laterally-extending portion 71a (i.e., a portion extending along the short side of the insulation layer 42 in FIG. 6) disposed in a back half portion of a left portion of the upper surface of the insulation layer 42, and a longitudinally-extending portion 71b (i.e., a portion extending along the long side of the insulation layer 42 in FIG. 6) extending rightward from a back end portion of the laterally-extending portion 71a. The laterally-extending portion 71a has a front end portion that is disposed directly below the capacitor land 52 on the back side, and that is connected to the capacitor land 52 through a via hole (not illustrated) extending through the insulation layer 41. The longitudinally-extending portion 71b is disposed directly below the drain lands 53, 54, 55 for the high side, and is connected to the drain lands 53, 54, 55 for the high side through via holes 76 (refer to FIG. 7) extending through the insulation layer 41.

The first negative-electrode-side power source conductive trace 72 includes a laterally-extending portion 72a (i.e., a portion extending along the short side of the insulation layer 42 in FIG. 6) disposed in a front half portion of the left portion of the upper surface of the insulation layer 42, and a longitudinally-extending portion 72b a portion extending along the long side of the insulation layer 42 in FIG. 6) extending rightward from a front end portion of the laterally-extending portion 72a. The laterally-extending portion 72a has a back end portion that is disposed directly below the capacitor land 51 on the front side, and that is connected to the capacitor land 51 through a via hole (not illustrated) extending through the insulation layer 41. The longitudinally-extending portion 72b is disposed directly below the source lands 62, 63, 64 for the low side, and is connected to the source lands 62, 63, 64 for the low side through via holes (not illustrated) extending through the insulation layer 41.

Each of the first U-phase conductive trace 73, the first V-phase conductive trace 74, and the first W-phase conductive trace 75 is in the shape of a rectangle elongated in the front-back direction in a plan view. The first U-phase conductive trace 73, the first V -phase conductive trace 74, and the first W-phase conductive trace 7 are disposed in a region in the upper surface of the insulation layer 42, which is sandwiched between the first positive-electrode-side power source conductive trace 71 and the first negative-electrode-side power source conductive trace 72, so as to be arranged in this order from the left at intervals in the right-left direction. The first U-phase conductive trace 73 has a back end portion that is disposed directly below the source land 56 for the U-phase high side, and that is connected to the source land 56 for the U-phase high side through a via hole (not illustrated) extending through the insulation layer 41. The first U-phase conductive trace 73 has a front end portion that is disposed directly below the drain land 59 for the U-phase low side, and that is connected to the drain land 59 for the U-phase low side through a via hole (not illustrated) extending through the insulation layer 41.

The first V-phase conductive trace 74 has a back end portion that is disposed directly below the source land 57 for the V-phase high side, and that is connected to the source land 57 for the V-phase high side through a via hole (not illustrated) extending through the insulation layer 41. The first V-phase conductive trace 74 has a front end portion that is disposed directly below the drain land 60 for the V-phase low side, and that is connected to the drain land 60 for the V-phase low side through a via hole (not illustrated) extending through the insulation layer 41. The first V-phase conductive trace 74 has a longitudinally-central portion that is disposed directly below a left end portion of the V-phase output conductive trace 66, and that is connected to the left end portion of the V-phase output conductive trace 66 through a via hole (not illustrated) extending through the insulation layer 41.

The first W-phase conductive trace 75 has a back end portion that is disposed directly below the source land 58 for the W-phase high side, and that is connected to the source land 58 for the W-phase high side through a via hole (not illustrated) extending through the insulation layer 41. The first W-phase conductive trace 75 has a front end portion that is disposed directly below the drain land 61 for the W-phase low side, and that is connected to the drain land 61 for the W-phase low side through a via hole (not illustrated) extending through the insulation layer 41.

The third conductive layer 33 includes gate signal lines (not illustrated) of the first switching devices UU1 to WL1. The gate signal lines are provided on an upper surface of the insulation layer 43. The gate signal line of each of the first switching devices UU1 to WU is connected to the corresponding gate land (included in the first conductive layer 31) through a via hole (not illustrated) extending through the insulation layers 42, 41. The sixth conductive layer 36 includes a plurality of lands and a plurality of conductive traces, which are provided on a lower surface of the insulation layer 45. The lands include a pair of capacitor lands 81, 82, a drain land 83 for the U-phase high side, a drain land 84 for the V-phase high side, a drain land 85 for the W-phase high side, a source land 86 for the U-phase high side, a source land 87 for the V-phase high side, and a source land 88 for the NV-phase high side. The lands further include a drain land 89 for the U-phase low side, a drain land 90 for the V-phase low side, a drain land 91 for the W-phase low side, a source land 92 for the U-phase low side, a source land 93 for the V-phase low side, and a source land 94 for the W-phase low side. The conductive traces include a U-phase output conductive trace 95, a V-phase output conductive trace 96, and a W-phase output conductive trace 97. While the sixth conductive layer 36 includes six gate lands to which the gate electrodes of the second switching devices UU2 to WL2 are connected by metal wires, illustrations thereof are omitted for convenience of description.

The capacitor lands 81, 82 are disposed in a central portion in a left portion of the lower surface of insulation layer 45 so as to be apart from each other in the front-back direction. The second smoothing capacitor C2 has a pair of electrodes. The electrodes of the second smoothing capacitor C2 are joined to the capacitor lands 81, 82. The drain land 83 for the U-phase high side, the drain land 84 for the V-phase high side, and the drain land 85 for the W-phase high side are disposed in a region close to the front end of the lower surface of the insulation layer 45 so as to be arranged in this order from the left at intervals in the right-left direction. Drain electrodes of the switching device UU2 on the U-phase high side, the switching device VU2 on the VU2 on the V-phase high side, and the switching device WU2 on the W-phase high side are respectively joined to the drain land 83 for the U-phase high side, the drain land 84 for the V-phase high side, and the drain land 85 for the W-phase high side.

The source land 86 for the U-phase high side, the source land 87 for the V-phase high side, and the source land 88 for the W-phase high side are respectively disposed on the back sides of the drain land 83 for the U-phase high side, the drain land 84 for the V-phase high side, and the drain land 85 for the W-phase high side. Source electrodes of the switching device UU2 on the U-phase high side, the switching device VU2 on the V-phase high side, and the switching device WU2 on the W-phase high side are respectively connected to the source land 86 for the U-phase high side, the source land 87 for the V-phase high side, and the source land 88 for the W-phase high side, through metal wires (not illustrated).

The drain land 89 for the U-phase low side, the drain land 90 for the V-phase low side, and the drain land 91 for the W-phase low side are disposed in a region close to the back end of the lower surface of the insulation layer 45, so as to be arranged in this order from the left at intervals in the right-left direction. The drain land 89 for the U-phase low side, the drain land 90 for the V-phase low side, and the drain land 91 for the W-phase low side are respectively aligned with the drain land 83 for the U-phase high side, the drain land 84 for the V-phase high side, and the drain land 85 for the W-phase high side in the front-back direction. Drain electrodes of the switching device UL2 on the U-phase low side, the switching device VL2 on the V-phase low side, and the switching device WL2 on the W-phase low side are respectively joined to the drain land 89 for the U-phase low side, the drain land 90 for the V-phase low side, and the drain land 91 for the W-phase low side.

The source land 92 for the U-phase low side, the source land 93 for the V-phase low side, and the source land 94 for the W-phase low side are respectively disposed on the back sides of the drain land 89 for the U-phase low side, the drain land 90 for the V-phase low side, and the drain land 91 for the W-phase low side. Source electrodes of the switching device UL2 on the U-phase low side, the switching device VL2 on the V-phase low side, and the switching device WL2 on the W-phase low side are respectively connected to the source land 92 for the U-phase low side, the source land 93 for the V-phase low side, and the source land 94 for the W-phase low side, through metal wires (not illustrated).

The U-phase output conductive trace 95 is integrally connected at its left end portion to a back end portion of the source land 86 for the U-phase high side, and linearly extends rightward from the left end portion. The U-phase output conductive trace 95 has a right end portion serving as a second 15-phase output terminal. The W-phase output conductive trace 97 is integrally connected at its left end portion to a front end portion of the drain land 91 for the W-phase low side, and linearly extends rightward from the left end portion. The W-phase output conductive trace 97 has a right end portion serving as a second W-phase output terminal. The V-phase output conductive trace 96 linearly extends rightward from a position between the source land 87 for the V-phase high side and the drain land 90 for the V-phase low side so as to pass through a region between the U-phase output conductive trace 95 and the W-phase output conductive trace 97. The V-phase output conductive trace 96 has a right end portion serving as a second V-phase output terminal.

The fifth conductive layer 35 includes a plurality of conductive traces, which are provided on the upper surface of the insulation layer 45. The conductive traces include a second positive-electrode-side power source conductive trace 101 constituting the second positive-electrode-side power supply line 21B, a second negative-electrode-side power source conductive trace 102 constituting the second negative-electrode-side power supply line 22B, a second U-phase conductive trace 103, a second V-phase conductive trace 104, and a second W-phase conductive trace 105. The second positive-electrode-side power source conductive trace 101 includes a laterally-extending portion 101a (a portion extending along the short side of the insulation layer 45 in FIG. 6) disposed in a front half portion of a left portion of the upper surface of the insulation layer 45, and a longitudinally-extending portion 101b (a portion extending along the long side of the insulation layer 45 in FIG. 6) extending rightward from a front end portion of the laterally-extending portion 101a. The second positive-electrode-side power source conductive trace 101 has an upper surface that faces, in the up-down direction, a lower surface of the first negative-electrode-side power source conductive trace 72 of the second conductive layer 32. In other words, the second positive-electrode-side power source conductive trace 101 has a planar shape substantially identical to that of the first negative-electrode-side power source conductive trace 72, and is disposed directly below the first negative-electrode-side power source conductive trace 72.

The laterally-extending portion 101a has a back end portion that is disposed directly above the capacitor land 81 on the front side, and that is connected to the capacitor land 81 through a via hole (not illustrated) extending through the insulation layer 45. The longitudinally-extending portion 71b is disposed directly above the drain lands 83, 84, 85 for the high side, and is connected to the drain lands 83, 84, 85 for the high side through via holes (not illustrated) extending through the insulation layer 45.

The second negative-electrode-side power source conductive trace 102 includes a laterally-extending portion 102a disposed in a back half portion of a left portion of the upper surface of the insulation layer 45, and a longitudinally-extending portion 102b extending rightward from a back end portion of the laterally-extending portion 102a. The second negative-electrode-side power source conductive trace 102 has an upper surface that faces, in the up-down direction, a lower surface of the first positive-electrode-side power source conductive trace 71 of the second conductive layer 32. In other words, the second negative-electrode-side power source conductive trace 102 has a planar shape substantially identical to that of the first positive-electrode-side power source conductive trace 71, and is disposed directly below the first positive-electrode-side power source conductive trace 71.

The laterally-extending portion 102a has a front end portion that is disposed directly above the capacitor land 82 on the back side, and that is connected to the capacitor land 82 through a via hole (not illustrated) extending through the insulation layer 45. The longitudinally-extending portion 102b is disposed directly above the source lands 92, 93, 94 for the low side, and is connected to the source lands 92, 93, 94 for the low side through via holes 106 (refer to FIG. 7) extending through the insulation layer 45.

Each of the second U-phase conductive trace 103, the second V-phase conductive trace 104, and the second W-phase conductive trace 105 is in the shape of a 1.0 rectangle elongated in the front-back direction in a plan view. The second U-phase conductive trace 103, the second V-phase conductive trace 104, and the second W-phase conductive trace 105 are disposed in a region in the upper surface of the insulation layer 45, which is sandwiched between the second positive-electrode-side power source conductive trace 101 and the second negative-electrode-side power source conductive trace 102, so as to be arranged in this order from the left at intervals in the right-left direction.

Upper surfaces of the second U-phase conductive trace 103, the second V-phase conductive trace 104, and the second W-phase conductive trace 105 face, in the up-down direction, lower surfaces of the first U-phase conductive trace 73, the first V-phase conductive trace. 74, and the first W-phase conductive trace 75 of the second conductive layer 32, respectively. In other words, the second U-phase conductive trace 103, the second V-phase conductive trace 104, and the second W-phase conductive trace 105 respectively have planar shapes substantially identical to those of the first U-phase conductive trace 73, the first V-phase conductive trace 74, and the first W-phase conductive trace 75, and are respectively disposed directly below the first U-phase conductive trace 73, the first V-phase conductive trace 74, and the first W-phase conductive trace 75.

The second U-phase conductive trace 103 has a front end portion that is disposed directly above the source land 86 for the U-phase high side, and that is connected to the source land 86 for the U-phase high side through a via hole (not illustrated) extending through the insulation layer 45. The second U-phase conductive trace 103 has a back end portion that is disposed directly above the drain land 89 for the U-phase low side, and that is connected to the drain land 89 for the U-phase low side through a via hole (not illustrated) extending through the insulation layer 45.

The second V-phase conductive trace 104 has a front end portion that is disposed directly above the source land 87 for the V-phase high side, and that is connected to the source land 87 for the V-phase high side through a via hole (not illustrated) extending through the insulation layer 45. The second V-phase conductive trace 104 has a back end portion that is disposed directly above the drain land 90 for the V-phase low side, and that is connected to the drain land 90 for the V-phase low side through a via hole (not illustrated) extending through the insulation layer 45. The second V-phase conductive trace 104 has a longitudinally-central portion that is disposed directly above a left end portion of the V-phase output conductive trace 96, and that is connected to the left end portion of the V-phase output conductive trace 96 through a via hole (not illustrated) extending through the insulation layer 45.

The second W-phase conductive trace 105 has a front end portion that is disposed directly above the source land 88 for the W-phase high side, and that is connected to the source land 88 for the W-phase high side through a via hole (not illustrated) extending through the insulation layer 45. The second W-phase conductive trace 105 has a back end portion that is disposed directly above the drain land 91 for the W-phase low side, and that is connected to the drain land 91 for the W-phase low side through a via hole (not illustrated) extending through the insulation layer 45.

The fourth conductive layer 34 includes gate signal lines (not illustrated) of the second switching devices UU2 to WL2, which are provided on the insulation layer 44. The gate signal line of each of the second switching devices UU2 to WL2 is connected to the corresponding gate land (included in the sixth conductive layer 36) through a via hole (not illustrated) extending through the insulation layers 44, 45. In FIG. 6, arrows illustrated in the conductive traces 71 to 75 included in the second conductive layer 32 and arrows illustrated in the conductive traces 101 to 105 included in the fifth conductive layer 35, denote the directions of currents flowing through the conductive traces 71 to 75 and the conductive traces 101 to 105 when currents flow through the portions of the first and second driving circuits 6, 7 in the directions as indicated by the arrows in FIG. 5.

When currents flow through the portions of the first and second driving circuits 6, 7 in the directions as indicated by the arrows in FIG. 5, a current flows through the first positive-electrode-side power source conductive trace 71 in a direction opposite to the direction in which a current flows through the second negative-electrode-side power source conductive trace 102 disposed so as to face the first positive-electrode-side power source conductive trace 71. In addition, a current flows through the first negative-electrode-side power source conductive trace 72 in a direction opposite to the direction in which a current flows through the second positive-electrode-side power source conductive trace 101 disposed so as to face the first negative-electrode-side power source conductive trace 72. A current flows through a front-side facing section of the first U-phase conductive trace 73 in a direction opposite to the direction in which a current flows through a front-side facing section of the second 12-phase conductive trace 103 disposed so as to face the first U-phase conductive trace 73. A current flows through a back-side facing section of the first V-phase conductive trace 74 in a direction opposite to the direction in which a current flows through a back-side facing section of the second V-phase conductive trace 104 disposed so as to face the first V-phase conductive trace 74. A current flows through a front-side facing section of the first W-phase conductive trace 75 in a direction opposite to the direction in which a current flows through a front-side facing section of the second W-phase conductive trace 105 disposed so as to face the first W-phase conductive trace 75. As described above, in at least parts of the facing sections of each of the pairs of conductive traces (71, 102), (72, 101), (73, 103), (74, 104), (75, 105), currents flow in the directions opposite to each other. Thus, inductances of the conductive traces 71 to 75 and the conductive traces 101 to 105 are at least partially cancelled out. As a result, the inductances of the conductive traces 71 to 75 and the conductive traces 101 to 105 are reduced.

In the power module 3 described above, the first positive-electrode-side power source conductive trace 71 faces, in the up-down direction, the second negative-electrode-side power source conductive trace 102. The first negative-electrode-side power source conductive trace 72 faces, in the up-down direction, the second positive-electrode-side power source conductive trace 101. The first U-phase conductive trace 73, the first V-phase conductive trace 74, and the first W-phase conductive trace 75 face, in the up-down direction, the second U-phase conductive trace 103, the second V-phase conductive trace 104, and the second W-phase conductive trace 105, respectively. In at least parts of the facing sections of each of the pairs of conductive traces, currents flow in the directions opposite to each other. Thus, inductances of the conductive traces are at least partially cancelled out, and the inductance of the internal conductive trace of the power module 3 can be reduced. As a result, surge voltage can be reduced.

Figure 8:
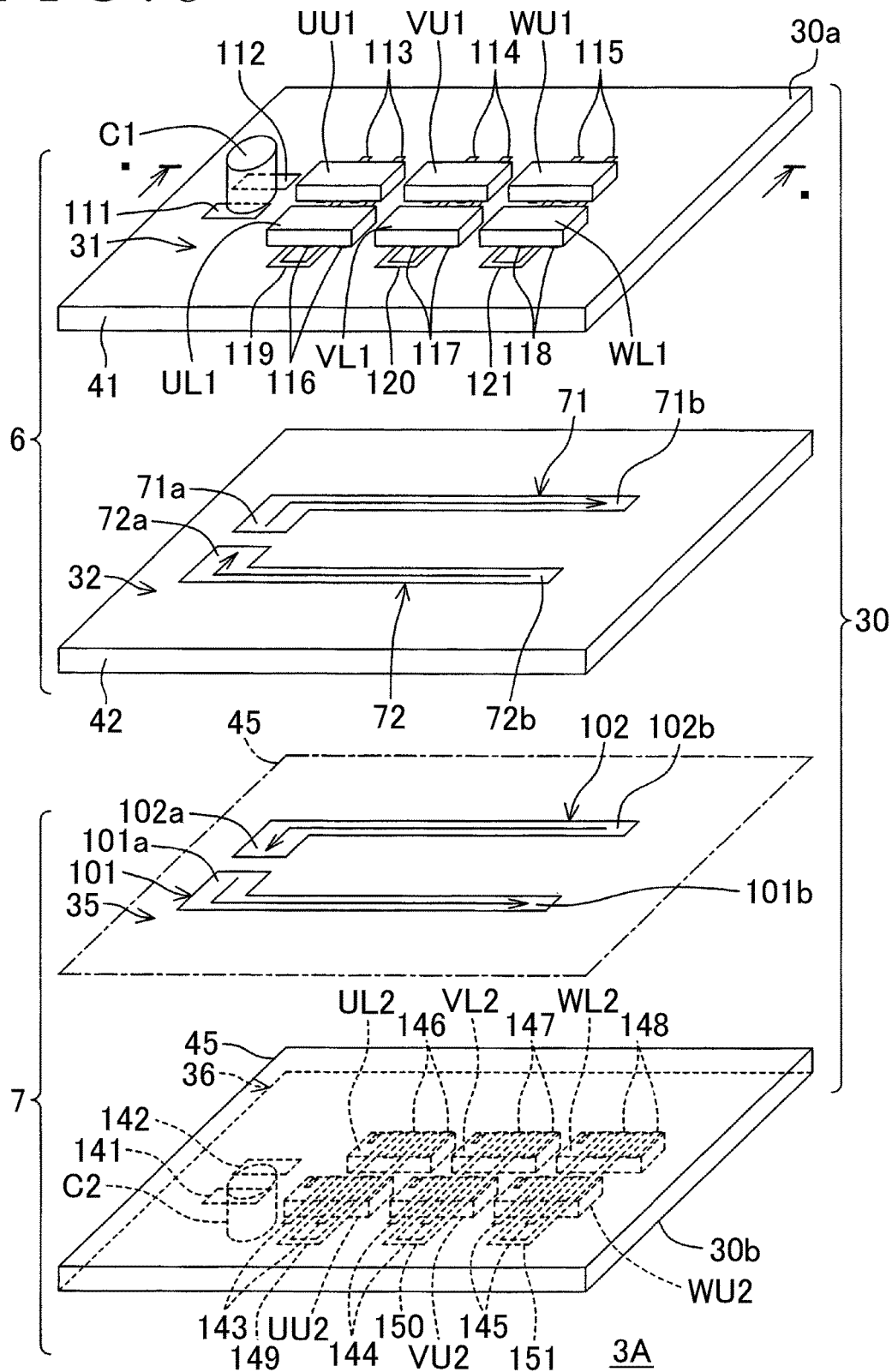
FIG. 8 is an exploded perspective view illustrating the configuration of a power module according to a second embodiment of the invention.
Figure 9:
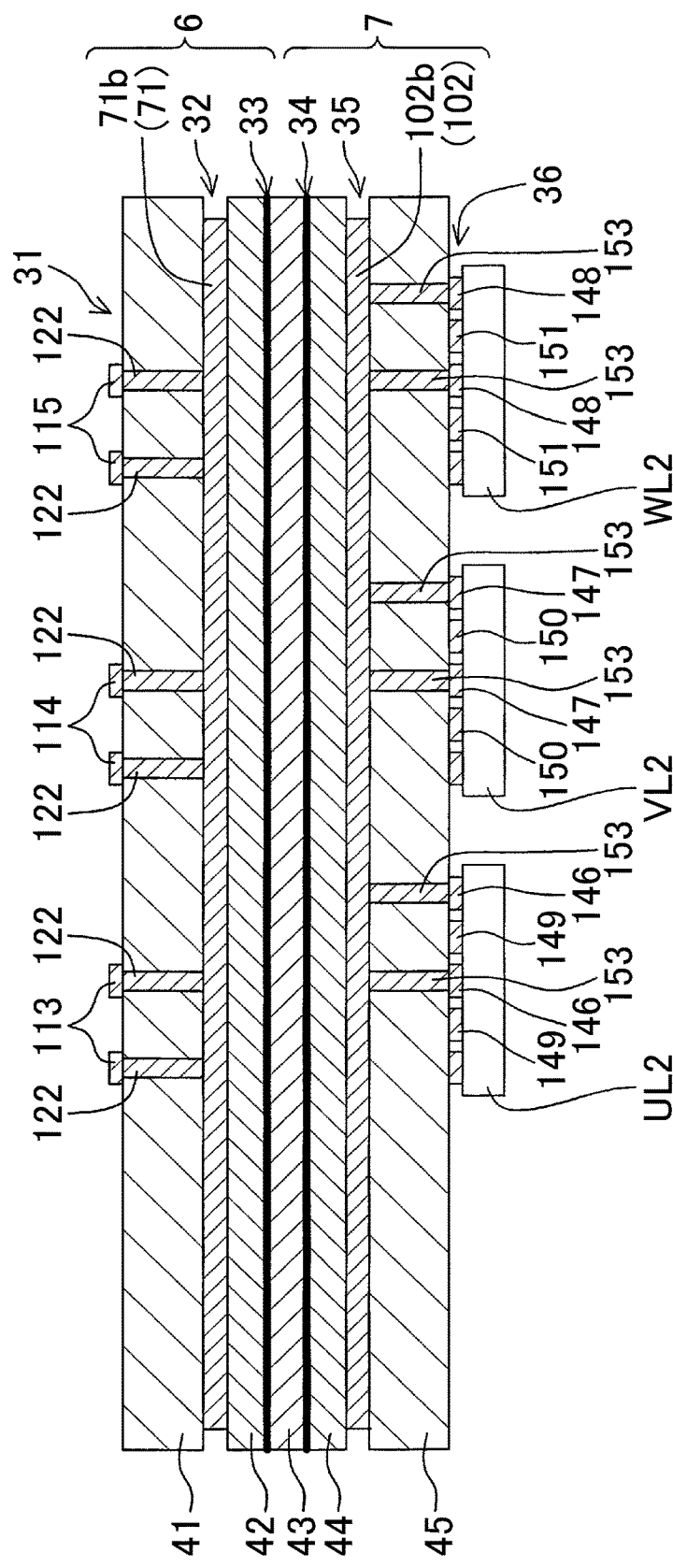
FIG. 9 is a sectional view taken along line IX-IX in FIG. 8.
Figure 10:
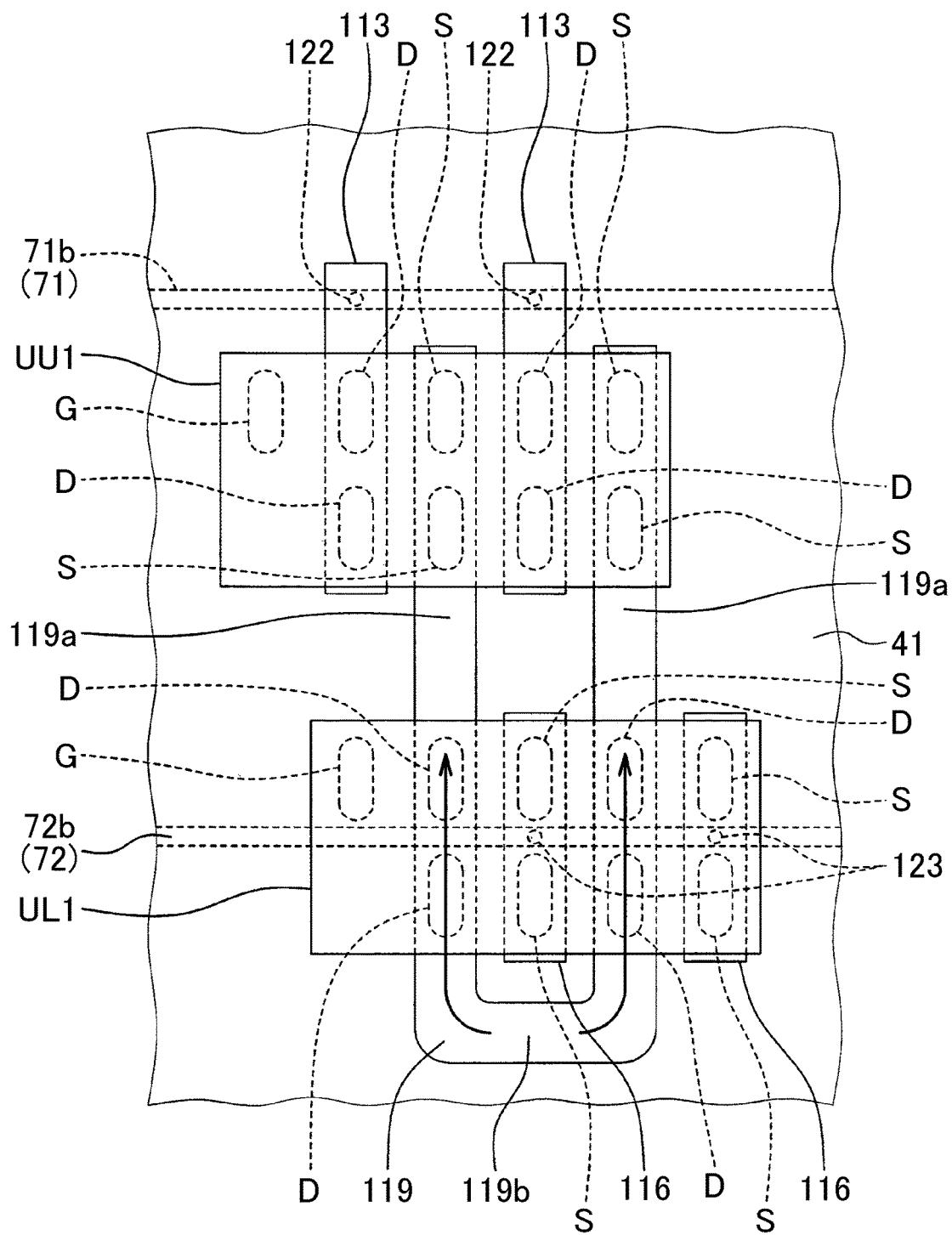
FIG. 10 is a partially enlarged plan view illustrating a first U-phase circuit in FIG. 9.
Figure 11:
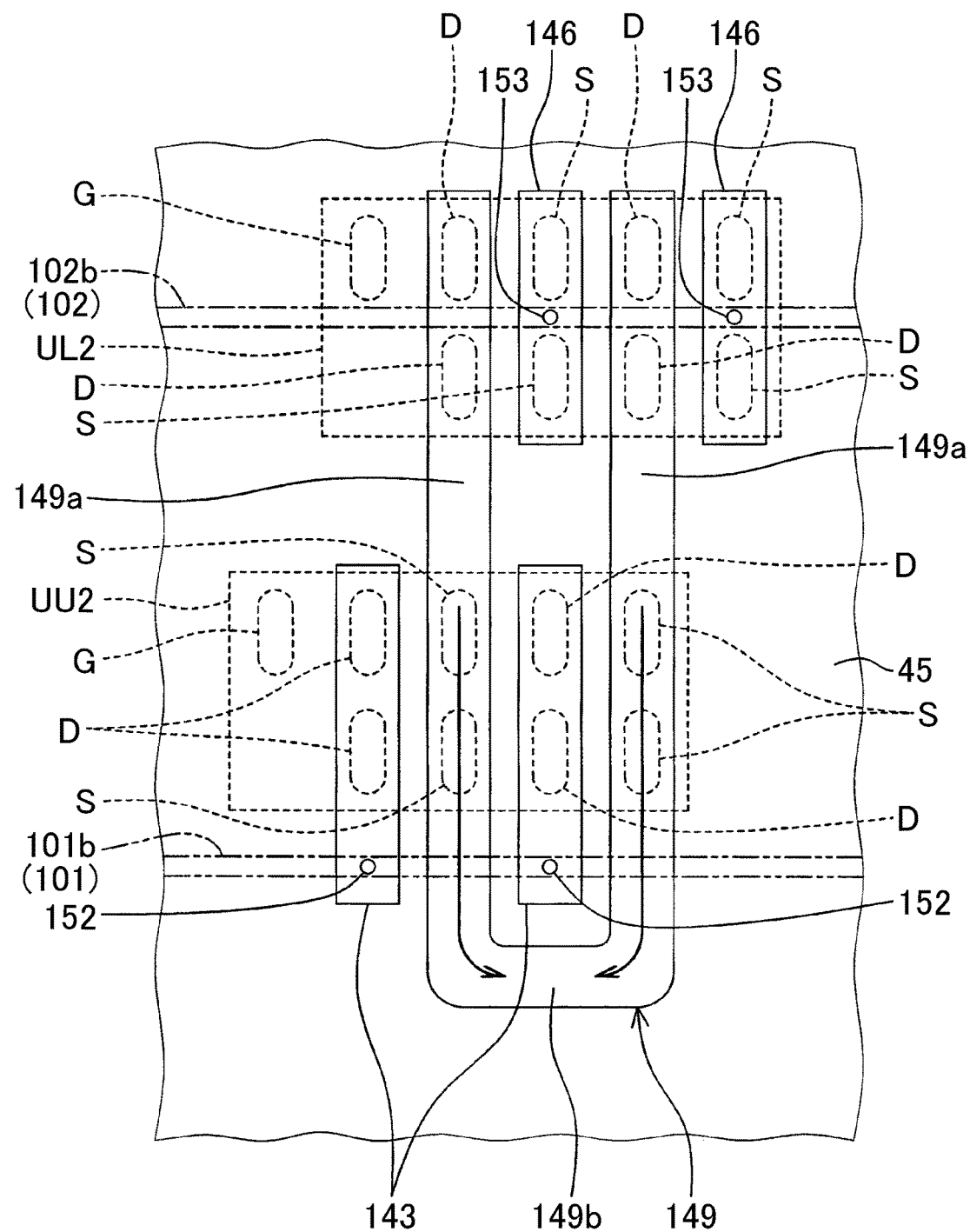
FIG. 11 is a partially enlarged plan view illustrating a second U-phase circuit in FIG. 9.

FIG. 8 is an exploded perspective view schematically illustrating the configuration of a power module according to a second embodiment of the invention. FIG. 9 is a sectional view taken along line IX-IX in FIG. 8. FIG. 10 is a partially enlarged plan view illustrating a first U-Phase circuit in FIG. 9. FIG. 11 is a partially enlarged plan view illustrating a second U-Phase circuit in FIG. 9. In FIG. 8 and FIG. 9, elements corresponding to the elements in FIG. 6 and FIG. 7 are denoted by the same reference numeral as those in FIG. 6 and FIG. 7.

In the description below, "left" denotes the left side in FIG. 8, "right" denotes the right side in FIG. 8, "front" denotes the front side in FIG. 8, and "back" denotes the back side in FIG. 8. In addition, "upper" denotes the upper side in FIG. 9, and "lower" denotes the lower side in FIG. 9. A power module 3A includes a multilayer circuit board 30 having a rectangular shape in a plan view. The multilayer circuit board 30 has a multilayer structure including a first conductive layer (surface-layer conductive trace) 31, a second conductive layer (inner layer conductive trace) 32, a third conductive layer (inner layer conductive trace) 33, a fourth conductive layer (inner layer conductive trace) 34, a fifth conductive layer (inner layer conductive trace) 35, a sixth conductive layer (back layer conductive trace) and insulation layers 41, 42, 43, 44, 45 provided between the conductive layers. The layers are bonded together through thermocompression bonding. In FIG. 8, the third conductive layer 33, the fourth conductive layer 34, the insulation layer 43, and the insulation layer 44 are omitted for convenience of description.

The first smoothing capacitor C1 and the first switching devices UU1 to WL1, which constitute the first driving circuit 6, are mounted on a surface 30a (a first principal surface, an upper surface in FIG. 8) of the multilayer circuit board 30. The surface 30a is a surface on the first conductive layer 31-side. The first smoothing capacitor C1 is disposed in a central portion in the front-back direction, in a left portion of the surface 30a of the multilayer circuit board 30, in a plan view. Hereinafter, a straight line that passes through a region near the center in the front-back direction, in the surface 30a of the multilayer circuit board 30, and that extends in the right-left direction will be referred to as "front-back center line of the surface 30a of the multilayer circuit board 30". The first switching devices UU1, VU1, WU1, which are respectively on the U-phase high side, the V-phase high side, and the W-phase high side, are disposed in a region on the back side of the front-back center line of the surface 30a of the multilayer circuit board 30 so as to be arranged in this order from the left at intervals in the right-left direction, in a plan view. The first switching devices UL1, VL1, WU1, which are respectively on the U-phase low side, the V-phase low side, and the W-phase low side, are disposed in a region on the front side of the front-back center line of the surface 30a of the multilayer circuit board 30 so as to be arranged in this order from the left at intervals in the right-left direction, in a plan view.

The second smoothing capacitor C2 and the second switching devices UU2 to WL2, which constitute the second driving circuit 7, are mounted on a surface 30b (a back surface, a second principal surface, a lower surface in FIG. 8) of the multilayer circuit board 30. The surface 30b is a surface on the sixth conductive layer 36-side. The second smoothing capacitor C2 is disposed in a central portion in the front-back direction, in a left portion of the back surface 30b of the multilayer circuit board 30, in a plan view. Hereinafter, a straight line that passes through a region near the center in the front-back direction, in the back surface 30b of the multilayer circuit board 30, and that extends in the right-left direction will be referred to as "front-hack center line of the back surface 30b of the multilayer circuit board 30". The second switching devices UU2, VU2, WU2, which are respectively on the U-phase high side, the V-phase high side, and the NV-phase high side, are disposed in a region on the front side of the front-back center line of the surface 30b of the multilayer circuit board 30 so as to be arranged in this order from the left at intervals in the right-left direction, in a plan view. The second switching devices UL2, VL2, WL2, which are respectively on the U-phase low side, the V-phase low side, and the W-phase low side, are disposed in a region on the back side of the front-back center line of the surface 30b of the multilayer circuit board 30 so as to be arranged in this order from the left at intervals in the right-left direction, in a plan view.

Each of the switching devices UU1 to WL1 and UU2 to WL2 is a horizontal switching device having a drain electrode, a source electrode, and a gate electrode on one surface thereof, and having no electrode on an opposite surface thereof. Hereinafter, a surface of each of the switching devices UU1 to WL1 and UU2 to WL2, on which the electrodes are provided, will be sometimes referred to as "electrode surface", and a surface on the opposite side of each of the switching devices UU1 to WL1 and UU2 to WL2 from the electrode surface, on which no electrode is provided, will be sometimes referred to as "non-electrode surface".

Figure 12:
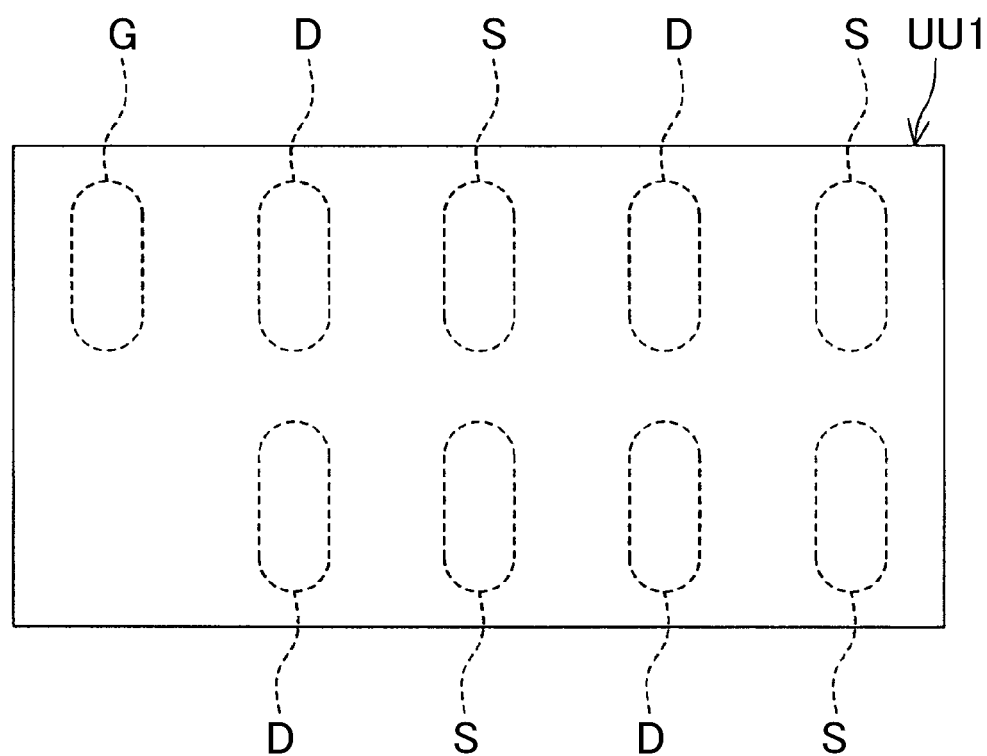
FIG. 12 is a plan view of a horizontal switching device.

FIG. 12 is a plan view of a horizontal switching device. The horizontal switching device UU1 is in the shape of a rectangular parallelepiped that is transversely elongated in a plan view. In an example in FIG. 12, an upper surface of the switching device UU1 is a non-electrode surface, and a lower surface thereof is an electrode surface. In a region near one long side of the electrode surface (lower surface) of the switching device UU1, a plurality of electrodes is disposed such that the electrode are arranged at intervals in a direction (transverse direction) along the one long side. The electrodes disposed in the region near the one long side of the electrode surface include one gate electrode G, which is a leftmost electrode, two drain electrodes D, and two source electrodes S. The drain electrodes D and the source electrodes S are alternately disposed. In this example, one of the drain electrodes D is disposed adjacent to the gate electrode G.

In a region near the other long side of the electrode surface, two drain electrodes D are provided at such positions as to face the two drain electrodes D provided in the region near the one long side of the electrode surface, and two source electrodes S are provided at such positions as to face the two source electrodes S provided in the region near the one long side of the electrode surface. The configuration of each of the switching devices UV1 to WL1 and UU2 to WL2, other than the switching device UU1, is the same as that of the switching device UU1.

The first conductive layer 31, the second conductive layer 32, and the third conductive layer 33 constitute lands, conductive traces, and so forth for the first driving circuit 6. The fourth conductive layer 34, the fifth conductive layer 35, and the sixth conductive layer 36 constitute lands, conductive traces, and so forth for the second driving circuit 7. The first conductive layer 31 includes a plurality of lands and a plurality of conductive traces, which are provided on an upper surface of the insulation layer 41. The lands include a pair of front and back capacitor lands 111, 112. The conductive traces include a pair of right and left drain conductive traces 113 for the U-phase high side, a pair of right and left drain conductive traces 114 for the V-phase high side, a pair of right and left drain conductive traces 115 for the W-phase high side, a pair of right and left source conductive traces 116 for the U-phase low side, a pair of right and left source conductive traces 117 for the V-phase low side, a pair of right and left source conductive traces 118 for the W-phase low side, a first U-phase conductive trace 119, a first V-phase conductive trace 120, and a first W-phase conductive trace 121. While the first conductive layer 31 includes six gate lands to which the gate electrodes of the first switching devices UU1 to WL1 are joined, illustrations thereof are omitted for convenience of description.

The capacitor lands 111, 112 are disposed in a central portion in a left portion of an upper surface of the insulation layer 41 so as to be apart from each other in the front-hack direction. The first smoothing capacitor C1 has a pair of electrodes. The electrodes of the first smoothing capacitor C1 are joined to the capacitor lands 111, 112. The pair of right and left drain conductive traces 113 for the U-phase high side, the pair of right and left drain conductive traces 114 for the V-phase high side, and the pair of right and left drain conductive traces 115 for the W-phase high side are disposed in a region on the back side of a front-back center line of the upper surface of the insulation layer 41 so as to be arranged in this order from the left at intervals in the right-left direction. Each of the drain conductive traces 113, 114, 115 is in the shape of a rectangle elongated in the front-back direction in a plan view.

A pair of the left-side front and back drain electrodes D of the switching device UU1 on the U-phase high side is joined to the left drain conductive trace 113 for the U-phase high side, and a pair of the right-side front and back drain electrodes D of the switching device UU1 on the U-phase high side is joined to the right drain conductive trace 113 for the U-phase high side (refer to FIG. 8 and FIG. 10). A pair of the left-side front and back drain electrodes D of the switching device VU1 on the V-phase high side is joined to the left drain conductive trace 114 for the V-phase high side, and a pair of the right-side front and back drain electrodes D of the switching device VU1 on the V-phase high side is joined to the right drain conductive trace 114 for the V-phase high side. A pair of the left-side front and back drain electrodes D of the switching device WU1 on the W-phase high side is joined to the left drain conductive trace 115 for the W-phase high side, and a pair of the right-side from and back drain electrodes D of the switching device WU1 on the W-phase high side is joined to the right drain conductive trace 115 for the W-phase high side.

A front end of each of the drain conductive traces 113, 114, 115 is positioned near the front long side of the corresponding one of the switching devices UU1, VU1, WU1 on the high side in a plan view, and a back end portion of each of the drain conductive traces 113, 114, 115 projects backward from the rear long side of the corresponding one of the switching devices UU1, VU1, WU1 on the high side in a plan view. The pair of right and left source conductive traces 116 for the U-phase low side, the pair of right and left source conductive traces 117 for the V-phase low side, and the pair of right and left source conductive traces 118 for the W-phase low side are disposed in a region on the front side of the front-back center line of the upper surface of the insulation layer 41 so as to be arranged in this order from the left at intervals in the right-left direction. Each of the source conductive traces 116, 117, 118 is in the shape of a rectangle elongated in the front-back direction in a plan view.

A pair of the left-side front and back source electrodes S of the switching device UL1 on the U-phase low side is joined to the left source conductive trace 116 for the U-phase low side, and a pair of the right-side front and back source electrodes S of the switching device UL1 on the U-phase low side is joined to the right source conductive trace 116 for the U-phase low side (refer to FIG. 8 and FIG. 10). A pair of the left-side front and back source electrodes S of the switching device VL1 on the V-phase low side is joined to the left source conductive trace 117 for the V-phase low side, and a pair of the right-side front and back source electrodes S of the switching device VL1 on the V-phase low side is joined to the right source conductive trace 117 for the V-phase low side. A pair of the left-side front and back source electrodes S of the switching device WL1 on the W-phase low side is joined to the left source conductive trace 118 for the W-phase low side, and a pair of the right-side front and back source electrodes S of the switching device WL1 on the W-phase low side is joined to the right source conductive trace 118 for the W-phase low side.

A front end of each of the source conductive traces 116, 117, 118 is positioned near the front long side of the corresponding one of the switching devices UL1, VL1, WL1 on the low side in a plan view, and a back end portion of each of the source conductive traces 116, 117, 118 is positioned near the rear long side of the corresponding one of the switching devices UL1, VL1, WL1 on the low side in a plan view. The first U-phase conductive trace 119 includes a pair of right and left laterally-extending portions 119a (i.e., portions extending along the short side of the insulation layer 41 in FIG. 8) extending in the front-back direction, and a connecting portion 119b connecting front ends of the laterally-extending portions 119a to each other (refer to FIG. 10). The left laterally-extending portion 119a is joined to the pair of the left-side source electrodes S of the switching device UU1 on the U-phase high side, and the pair of the left-side drain electrodes D of the switching device UL1 on the U-phase low side. The right laterally-extending portion 119a is joined to the pair of the right-side source electrodes S of the switching device UU1 on the U-phase high side, and the pair of the right-side drain electrodes D of the switching device UL1 on the U-phase low side. Front end portions of the left laterally-extending portion 119a and the right laterally-extending portion 119a project forward from the front long side of the switching device UL1 on the U-phase low side, and the front end portions are connected to each other by the connecting portion 119b. The connecting portion 119b constitutes the first U-phase output terminal.

The first V-phase conductive trace 120 includes a pair of right and left laterally-extending portions (i.e., portions extending along the short side of the insulation layer 41 in FIG. 8) extending in the front-back direction, and a connecting portion connecting front ends of the laterally-extending portions to each other. The left laterally-extending portion of the first V-phase conductive trace 120 is joined to the pair of the left-side source electrodes S of the switching device VU1 on the V-phase high side, and the pair of the left-side drain electrodes D of the switching device VL1 on the V-phase low side. The right laterally-extending portion of the first V-phase conductive trace 120 is joined to the pair of the right-side source electrodes S of the switching device VU1 on the V-phase high side, and the pair of the right-side drain electrodes D of the switching device VL1 on the V-phase low side. Front end portions of the left laterally-extending portion and the right laterally-extending portion of the first V-phase conductive trace 120 project forward from the front long side of the switching device VL1 on the V-phase low side, and the front end portions are connected to each other by the connecting portion. The connecting portion constitutes the first V-phase output terminal.

The first W-phase conductive trace 121 includes a pair of right and left laterally-extending portions (i.e., portions extending along the short side of the insulation layer 41 in FIG. 8) extending in the front-back direction, and a connecting portion connecting front ends of the laterally-extending portions to each other. The left laterally-extending portion of the first W-phase conductive trace 121 is joined to the pair of the left-side source electrodes S of the switching device WU1 on the W-phase high side, and the pair of the left-side drain electrodes D of the switching device WL1 on the W-phase low side. The right laterally-extending portion of the first W-phase conductive trace 121 is joined to the pair of the right-side source electrodes S of the switching device WU1 on the W-phase high side, and the pair of the right-side drain electrodes D of the switching device WL1 on the W-phase low side. Front end portions of the left laterally-extending portion and the right laterally-extending portion of the first W-phase conductive trace 121 project forward from the front long side of the switching device WL1 on the W-phase low side, and the front end portions are connected to each other by the connecting portion. The connecting portion constitutes the first W-phase output terminal.

The second conductive layer 32 includes the first positive-electrode-side power source conductive trace 71 constituting the first positive-electrode-side power supply line 21A, and the first negative-electrode-side power source conductive trace 72 constituting the first negative-electrode-side power supply line 22A, which are provided on the upper surface of the insulation layer 42. The first positive-electrode-side power source conductive trace 71 includes a laterally-extending portion 71*a* (i.e., a portion extending along the short side of the insulation layer 42 in FIG. 8) disposed in a region on the back side of the front-back center in a left portion of the upper surface of the insulation layer 42, and a longitudinally-extending portion 71*b* (i.e., a portion extending along the long side of the insulation layer 42 in FIG. 8) extending rightward from a back end portion of the laterally-extending portion 71*a*. The laterally-extending portion 71*a* has a front end portion that is disposed directly below the capacitor land 112 on the back side, and that is connected to the capacitor land 112 through a via, hole (not illustrated) extending through the insulation layer 41. The longitudinally-extending portion 71*b* is disposed directly below the drain conductive traces 113, 114, 115 for the high side, and is connected to the back end portions of the drain conductive traces 113, 114, 115 for the high side through via holes 122 (refer to FIG. 9 and FIG. 10) extending through the insulation layer 41.

The first negative-electrode-side power source conductive trace 72 includes a laterally-extending portion 72*a* (i.e., a portion extending along the short side of the insulation layer 42 in FIG. 8) disposed in a region on the front side of the front-back center in the left portion of the upper surface of the insulation layer 42, and a longitudinally-extending portion 72*b* (i.e., a portion extending along the long side of the insulation layer 42 in FIG. 8) extending rightward from a front end portion of the laterally-extending portion 72*a*. The laterally-extending portion 72*a* has a back end portion that is disposed directly below the capacitor land 111 on the front side, and that is connected to the capacitor land 111 through a via hole (not illustrated) extending through the insulation layer 41. The longitudinally-extending portion 72*b* is disposed directly below the source conductive traces 116, 117, 118 for the low side, and is connected to the front-back center portions of the source conductive traces 116, 117, 118 for the low side through via holes 123 (refer to FIG. 10) extending through the insulation layer 41.

The third conductive layer 33 includes gate signal lines (not illustrated) of the first switching devices UU1 to WL1. The gate signal lines are provided on an upper surface of the insulation layer 43. The gate signal line of each of the first switching devices UU1 to WL1 is connected to the corresponding gate land (included in the first conductive layer 31) through a via hole (not illustrated) extending through the insulation layers 42, 41. The sixth conductive layer 36 includes a plurality of lands and a plurality of conductive traces, which are provided on a lower surface of the insulation layer 45. The lands include a pair of front and back capacitor lands 141, 142. The conductive traces include a pair of right and left drain conductive traces 143 for the U-phase high side, a pair of right and left drain conductive traces 144 for the V-phase high side, a pair of right and left drain conductive traces 145 for the W-phase high side, a pair of right and left source conductive traces 146 for the U-phase low side, a pair of right and left source conductive traces 147 for the V-phase low side, a pair of right and left source conductive traces 148 for the W-phase low side, a second U-phase conductive trace 149, a second V-phase conductive trace 150, and a second W-phase conductive trace 151. While the sixth conductive layer 36 includes six gate lands to which the gate electrodes of the second switching devices UU2 to WL2 are joined, illustrations thereof are omitted for convenience of description.

The capacitor lands 141, 142 are disposed in a central portion in a left portion of a lower surface of the insulation layer 45 so as to be arranged at intervals in the front-back direction. The second smoothing capacitor C2 has a pair of electrodes. The electrodes of the second smoothing capacitor C2 are joined to the capacitor lands 141, 142. The pair of right and left drain conductive traces 143 for the U-phase high side, the pair of right and left drain conductive traces 144 for the V-phase high side, and the pair of right and left drain conductive traces 145 for the W-phase high side are disposed in a region on the front side of the front-back center of a lower surface of the insulation layer 45 so as to be arranged in this order from the left at intervals in the right-left direction. Each of the drain conductive traces 143, 144, 145 is in the shape of a rectangle elongated in the front-back direction in a plan view.

A pair of the left-side front and back drain electrodes D of the switching device UU2 on the U-phase high side is joined to the left drain conductive trace 143 for the U-phase high side, and a pair of the right-side front and back drain electrodes of the switching device UU2 on the U-phase high side is joined to the right drain conductive trace 143 for the U-phase high side (refer to FIG. 8 and FIG. 11). A pair of the left-side front and back drain electrodes I) of the switching device VU2 on the V-phase high side is joined to the left drain conductive trace 144 for the V-phase high side, and a pair of the right-side front and back drain electrodes D of the switching device VU2 on the V-phase high side is joined to the right drain conductive trace 144 for the V-phase high side. A pair of the left-side front and back drain electrodes D of the switching device WU2 on the W-phase high side is joined to the left drain conductive trace 145 for the W-phase high side, and a pair of the right-side front and back drain electrodes D of the switching device WU2 on the W-phase high side is joined to the right drain conductive trace 145 for the W-phase high side.

A back end of each of the drain conductive traces 143, 144, 145 is positioned near the rear long side of the corresponding one of the switching devices UU2, VU2, WU2 on the high side in a plan view, and a front end portion of each of the drain conductive traces 143, 144, 145 projects forward from the front long side of the corresponding one of the switching devices UU2, VU2 WU2 on the high side in a plan view. The pair of right and left source conductive traces 146 for the U-phase low side, the pair of right and left source conductive traces 147 for the V-phase low side, and the pair of right and left source conductive traces 148 for the W-phase low side are disposed in a region on the back side of the front-back center line of the lower surface of the insulation layer 45 so as to be arranged in this order from the left at intervals in the right-left direction. Each of the source conductive traces 146, 147, 148 is in the shape of a rectangle elongated in the front-back direction in a plan view.

A pair of the left-side front and back source electrodes S of the switching device UL2 on the U-phase low side is joined to the left source conductive trace 146 for the U-phase low side, and a pair of the right-side front and back source electrodes S of the switching device UL2 on the U-phase low side is joined to the right source conductive trace 146 for the U-phase low side (refer to FIG. 8 and FIG. 10). A pair of the left-side front and back source electrodes S of the switching device VL2 on the V-phase low side is joined to the left source conductive trace 147 for the V-phase low side, and a pair of the right-side front and back source electrodes S of the switching device VL2 on the V-phase low side is joined to the right source conductive trace 147 for the V-phase low side. A pair of the left-side front and back source electrodes S of the switching device WL2 on the W-phase low side is joined to the left source conductive trace 148 for the W-phase low side, and a pair of the right-side front and back source electrodes S of the switching device on the W-phase low side is joined to the right source conductive trace 148 for the W-phase low side.

A front end of each of the source conductive traces 146, 147, 148 is positioned near the front long side of the corresponding one of the low side switching devices UL2, VL2, WL2 in a plan view, and a back end portion of each of source conductive traces 146, 147, 148 is positioned near the rear long side of the corresponding one of the low side switching devices UL2, VL2, WL2 in a plan view. The second U-phase conductive trace 149 includes a pair of right and left laterally-extending portions 149a (i.e., portions extending along the short side of the insulation layer 45) extending in the front-back direction, and a connecting portion 149b connecting front ends of the laterally-extending portions 149a to each other (refer to FIG. 11). The second U-phase conductive trace 149 has an upper surface that faces, in the up-down direction, a lower surface of the first U-phase conductive trace 119. The left laterally-extending portion 149a is joined to a pair of the left-side source electrodes S of the switching device UU2 on the U-phase high side, and a pair of the left-side drain electrodes D of the switching device UL2 on the U-phase low side. The right laterally-extending portion 149a is joined to a pair of the right-side source electrodes S of the switching device UU2 on the U-phase high side, and a pair of the right-side drain electrodes D of the switching device UL2 on the U-phase low side. Front ends of the left laterally-extending portion 149a and the right laterally-extending portion 149a. project forward from the front long side of the switching device UU2 on the U-phase high side, and the front ends are connected to each other by the connecting portion 149b. The connecting portion 149b constitutes the second U-phase output terminal.

The second V-phase conductive trace 150 includes a pair of right and left laterally-extending portions (i.e., portions extending along the short side of the insulation layer 45) extending in the front-back direction, and a connecting portion connecting front ends of the laterally-extending portions to each other. The second V-phase conductive trace 150 has an upper surface that faces, in the up-down direction, a lower surface of the first V-phase conductive trace 120. The left laterally-extending portion of the second V-phase conductive trace 150 is joined to a pair of the left-side source electrodes S of the switching device VU2 on the V-phase high side, and a pair of the left-side drain electrodes D of the switching device VL2 on the V-phase low side. The right laterally-extending portion of the second V-phase conductive trace 150 is joined to a pair of the right-side source electrodes S of the switching device VU2 on the V-phase high side, and a pair of the right-side drain electrodes D of the switching device VL2 on the V-phase low side. Front end portions of the left laterally-extending portion and the right laterally-extending portion of the second V-phase conductive trace 150 project forward from the front long side of the switching device VU2 on the V-phase high side, and the front ends are connected to each other by the connecting portion. The connecting portion constitutes the second V-phase output terminal.

The second W-phase conductive trace 151 includes a pair of right and left laterally-extending portions (i.e., portions extending along the short side of the insulation layer 45) extending in the front-back direction, and a connecting portion connecting front ends of the laterally-extending portions to each other. The second W-phase conductive trace 151 has an upper surface that faces, in the up-down direction, a lower surface of the first W-phase conductive trace 121. The left laterally-extending portion of the second W-phase conductive trace 151 is joined to a pair of the left-side source electrodes S of the switching device VW2 on the W-phase high side, and a pair of the left-side drain electrodes D of the switching device WL2 on the W-phase low side. The right laterally-extending portion of the second W-phase conductive trace 151 is joined to a pair of the right-side source electrodes S of the switching device WU2 on the W-phase high side, and a pair of the right-side drain electrodes D of the switching device WL2 on the W-phase low side. Front end portions of the left laterally-extending portion and the right laterally-extending portion of the second W-phase conductive trace 151 project forward from the front long side of the switching device WU2 on the W-phase high side, and the front ends are connected to each other by the connecting portion. The connecting portion constitutes the second W-phase output terminal.

The fifth conductive layer 35 includes the second positive-electrode-side power source conductive trace 101 constituting a second positive-electrode-side power supply line 21B, and the second negative-electrode-side power source conductive trace 102 constituting a second negative-electrode-side power supply line 22B, which are provided on the upper surface of the insulation layer 45. The second positive-electrode-side power source conductive trace 101 includes a laterally-extending portion 101a (i.e., a portion extending along the short side of the insulation layer 45 in FIG. 8) disposed in a region on the front side of the front-back center in a left portion of the upper surface of the insulation layer 45, and a longitudinally-extending portion 101b (i.e., a portion extending along the long side of the insulation layer 45 in FIG. 8) extending rightward from a front end portion of the laterally-extending portion 101a. The second positive-electrode-side power source conductive trace 101 has an upper surface that faces, in the up-down direction, a lower surface of the first negative-electrode-side power source conductive trace 72 of the second conductive layer 32. In other words, the second positive-electrode-side power source conductive trace 101 has a planar shape substantially identical to that of the first negative-electrode-side power source conductive trace 72, and is disposed directly below the first negative-electrode-side power source conductive trace 72.

The laterally-extending portion 101a has a back end portion that is disposed directly above the capacitor land 141 on the front side, and that is connected to the capacitor land 141 through a via hole (not illustrated) extending through the insulation layer 45. The longitudinally-extending portion 101b is disposed directly above a front end portion of each of the drain conductive traces 143, 144, 145 for the high side, and is connected to the front end portions of the drain conductive traces 143, 144, 145 for the high side through via holes 152 (refer to FIG. 11) extending through the insulation layer 45.

The second negative-electrode-side power source conductive trace 102 includes a laterally-extending portion 102a (i.e., a portion extending along the short side of the insulation layer 45 in FIG. 8) disposed in a region on the back side of the front-back center in the left portion of the upper surface of the insulation layer 45, and a longitudinally-extending portion 102*b* (i.e., a portion extending along the long side of the insulation layer 45 in FIG. 8) extending rightward from a back end portion of the laterally-extending portion 102*a*. The second negative-electrode-side power source conductive trace 102 has an upper surface that faces, in the up-down direction, a lower surface of the first positive-electrode-side power source conductive trace 71 of the second conductive layer 32. In other words, the second negative-electrode-side power source conductive trace 102 has a planar shape substantially identical to that of the first positive-electrode-side power source conductive trace 71, and is disposed directly below the first positive-electrode-side power source conductive trace 71.

The laterally-extending portion 102*a* has a front end portion that is disposed directly above the capacitor land 142 on the back side, and that is connected to the capacitor land 142 through a via hole (not illustrated) extending through the insulation layer 45. The longitudinally-extending portion 102*b* is disposed directly above a front-back central portion of each of the source conductive traces 146, 147, 148 for the low side, and is connected to the front-back central portions of the source conductive traces 146, 147, 148 for the low side through via holes 153 (refer to FIG. 9, FIG. 11) extending through the insulation layer 45.

The fourth conductive layer 34 includes gate signal lines (not illustrated) of the second switching devices UU2 to WL2, which are provided on the insulation layer 44. The gate signal line of each of the second switching devices UU2 to WL2 is connected to the corresponding gate land (included in the sixth conductive layer 36) through a via hole (not illustrated) extending through the insulation layers 44, 45. In FIG. 8, FIG. 10, and FIG. 11, arrows illustrated in the U-phase conductive traces 119, 149, the positive-electrode-side power source conductive traces 71, 101, and the negative-electrode-side power source conductive traces 72, 102 denote the directions of currents flowing through these conductive traces when currents flow through the portions of the first and second driving circuits 6, 7 in the directions as indicated by the arrows in. FIG. 5.

When currents flow through the portions of the first and second driving circuits 6, 7 in the directions as indicated by the arrows in FIG. 5, a current flows through the first positive-electrode-side power source conductive trace 71 in a direction opposite to the direction in which a current flows through the second negative-electrode-side power source conductive trace 102 disposed so as to face the first positive-electrode-side power source conductive trace 71. In addition, a current flows through the first negative-electrode-side power source conductive trace 72 in a direction opposite to the direction in which a current flows through the first positive-electrode-side power source conductive trace 101 disposed so as to face the first negative-electrode-side power source conductive trace 72. A current flows through a part of a facing section of the first U-phase conductive trace 119 in a direction opposite to the direction in which a current flows through a part of a facing section of the second U-phase conductive trace 149 disposed so as to face the first U-phase conductive trace 119, as illustrated in FIG. 10 and FIG. 11. A current flows through a part of a facing section of the first V-phase conductive trace 120 in a direction opposite to the direction in which a current flows through a part of a facing section of the second V-phase conductive trace 150 disposed so as to face the first V-phase conductive trace 120. A current flows through a part of a facing section of the first W-phase conductive trace 121 in a direction opposite to the direction in which a current flows through a part of a facing section of the second W-phase conductive trace 151 disposed so as to face the first W-phase conductive trace 121. As described above, in at least parts of the facing sections of each of the pairs of conductive traces (71, 102), (72, 101), (119, 149), (120, 150), (121, 151), currents flow in the directions opposite to each other. Thus, inductances of the conductive traces 71, 72, 101, 102, 119 to 121, and 149 to 151 are at least partially cancelled out. As a result, the inductances of the conductive traces 71, 72, 101, 102, 119 to 121, and 149 to 151 are reduced.

In the power module 3A according to the second embodiment described above, the first positive-electrode-side power source conductive trace 71 faces the second negative-electrode-side power source conductive trace 102 in the up-down direction. The first negative-electrode-side power source conductive trace 72 faces the second positive-electrode-side power source conductive trace 101 in the up-down direction. The first U-phase conductive trace 119, the V-phase conductive trace 120, and the W-phase conductive trace 121 face, in the up-down direction, the second U-phase conductive trace 149, the V-phase conductive trace 150, and the W-phase conductive trace 151, respectively. Thus, in at least a part of the facing section of each of the pairs of conductive traces facing each other, currents flow in opposite directions. Thus, inductances of these conductive traces are at least partially cancelled out. As a result, the inductances of the internal conductive traces of the power module 3 are reduced. Consequently, surge voltage can be reduced.

In the first and second embodiments described above, the second motor coil 4B is disposed at a position 180 degrees offset, in phase, from the first motor coil 4A, and thus the current command values Id_2, Iq_2 for the second control unit 10B are respectively inverted in sign with respect to the current command values Id_1, Iq_1 for the first control unit 10A. However, the second motor coil 4B may be disposed in the same phase as that of the first motor coil 4A, and the current command values Id_2, Iq_2 for the second control unit 10B may be respectively identical in sign to the current command values Id_1, Iq_1 for the first control unit 10A.

Figure 13:
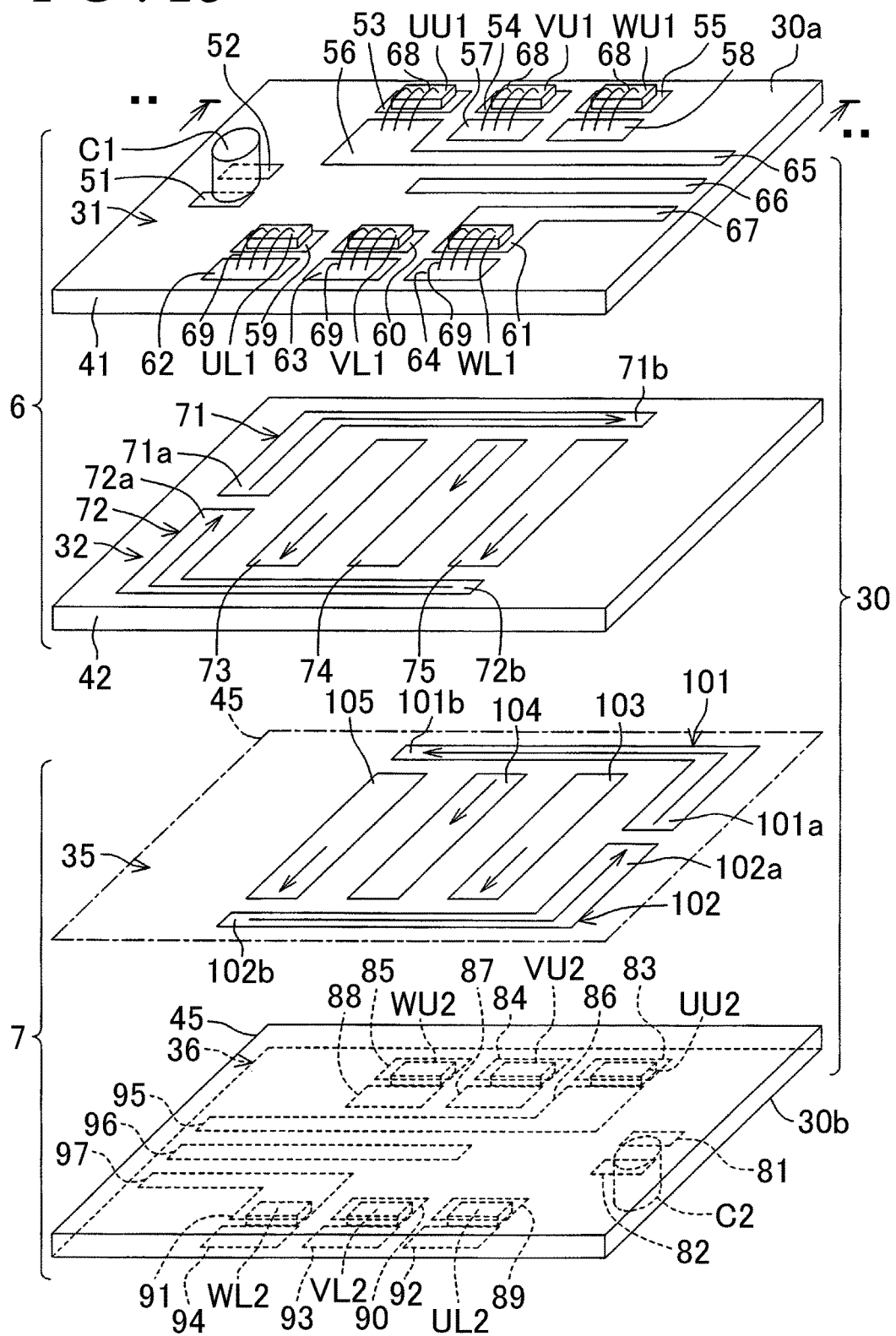
FIG. 13 is an exploded perspective view illustrating the configuration of a power module according to a third embodiment of the invention.

Even in this case, currents flow through the first positive-electrode-side power source conductive trace 71 and the second negative-electrode-side power source conductive trace 102, which are disposed so as to face each other, in opposite directions, and currents flow through the first negative-electrode-side power source conductive trace 72 and the second positive-electrode-side power source conductive trace 101, which are disposed so as to face each other, in opposite directions. As a result, inductances of the conductive traces can be reduced. FIG. 13 is an exploded perspective view illustrating the configuration of a power module according to a third embodiment of the invention. FIG. 14 is a sectional view taken along line XIV-XIV in FIG. 13. In FIG. 13 and FIG. 14, elements corresponding to the elements in FIG. 6 and FIG. 7 are denoted by the same reference numeral as those in FIG. 6 and FIG. 7. A power module 3B according to the third embodiment includes switching devices UU1 to WL1 and to UU2 to WL2, each of which is a vertical switching device. The power module 3B according to the third embodiment is similar to the power module 3 according to the first embodiment illustrated in FIG. 6 and FIG. 7.

The configurations of electronic components, lands, and conductive traces related to a first driving circuit 6 are identical to those illustrated in FIG. 6 and FIG. 7. That is, the manner of mounting a first smoothing capacitor C1 and the first switching devices UU1 to WL1 on a surface 30a of a multilayer circuit board 30 in the power module 3B and the configurations of a first conductive layer 31, a second conductive layer 32, and a third conductive layer 33 are similar to those of the power module 3 illustrated in FIG. 6 and FIG. 7.

In the power module 3B, the configurations of electronic components, lands, and conductive traces related to a second driving circuit 7 are different from those illustrated in FIG. 6 and FIG. 7. Specifically, a layout of a second smoothing capacitor C2 and the second switching devices UU2 to WL2, which are mounted on a back surface 30b of the multilayer circuit board 30 in the power module 3B, is obtained by turning the layout of the second smoothing capacitor C2 and the second switching devices UU2 to WL2, which are mounted on the back surface 30b of the multilayer circuit board 30, 180 degrees around the vertical axis passing through the center of the back surface of the multilayer circuit board 30 in FIG. 6.

A layout of lands 81 to 94 and conductive traces 95 to 97, which are provided in a sixth conductive layer 36 of the power module 3B, is obtained by turning the layout of the lands 81 to 94 and the conductive traces 95 to 97, which are provided in the sixth conductive layer 36 in FIG. 6, 180 degrees around the vertical axis passing through the center of the back surface of the multilayer circuit board 30. In addition, a layout of conductive traces 101 to 105, provided in a fifth conductive layer 35 of the power module 3B is obtained by turning the layout of the conductive traces 101 to 105, which are provided in the fifth conductive layer 35 in FIG. 6, 180 degrees around the vertical axis passing through the center of the back surface of the multilayer circuit board 30.

An upper surface of a longitudinally-extending portion 101b of the second positive-electrode-side power source conductive trace 101 faces, in the up-down direction, a lower surface of a longitudinally-extending portion 71b of a first positive-electrode-side power source conductive trace 71 of the second conductive layer 32. The second positive-electrode-side power source conductive trace 101 has a laterally-extending portion 101a having a front end portion that is disposed directly above a capacitor land 81 on the back side; and that is connected to the capacitor land 81 through a via hole (not illustrated) extending through an insulation layer 45. The second positive-electrode-side power source conductive trace 101 has a longitudinally-extending portion 71b that is disposed directly above each of drain lands 83, 84, 85 for the high side, and that is connected to the drain lands 83, 84, 85 for the high side through via holes 106 extending through the insulation layer 45.

An upper surface of a longitudinally-extending portion 102b of a second negative-electrode-side power source conductive trace 102 faces, in the up-down direction, a lower surface of a longitudinally-extending portion 72b of a first negative-electrode-side power source conductive trace 72 of the second conductive layer 32. The second negative-electrode-side power source conductive trace 102 has a laterally-extending portion 102a having a back end portion that is disposed directly above a capacitor land 82 on the front side, and that is connected to the capacitor land 82 through a via hole (not illustrated) extending through the insulation layer 45. The longitudinally-extending portion 102b is disposed directly above each of source lands 92, 93, 94 for the low side, and is connected to the source lands 92, 93, 94 for the low side through via holes (not illustrated) extending through the insulation layer 45.

Upper surfaces of a second U-phase conductive trace 103, a second V-phase conductive trace 104, and a second W-phase conductive trace 105 face, in the up-down direction, lower surfaces of a first W-phase conductive trace 75, a first V-phase conductive trace 74, and a first U-phase conductive trace 73 of the second conductive layer 32, respectively. The second U-phase conductive trace 103 has a back end portion that is disposed directly above a source land 86 for the U-phase high side, and that is connected to the source land 86 for the U-phase high side through a via hole (not illustrated) extending through the insulation layer 45. The second U-phase conductive trace 103 has a front end portion that is disposed directly above a drain land 89 for the U-phase low side, and that is connected to the drain land 89 for the U-phase low side through a via hole (not illustrated) extending through the insulation layer 45.

The second V-phase conductive trace 104 has a back end portion that is disposed directly above a source land 87 for the V-phase high side, and that is connected to the source land 87 for the U-phase high side through a via hole (not illustrated) extending through the insulation layer 45. The second V-phase conductive trace 104 has a front end portion that is disposed directly above a drain land 90 for the V-phase low side, and that is connected to the drain land 90 for the V-phase low side through a via hole (not illustrated) extending through the insulation layer 45. The second V-phase conductive trace 104 has a longitudinally central portion that is disposed directly above a right end portion of a V-phase output conductive trace 96, and that is connected to the right end portion of the V-phase output conductive trace 96 through a via hole (not illustrated) extending through the insulation layer 45.

The second W-phase conductive trace 105 has a back end portion that is disposed directly above a source land 88 for the W-phase high side, and that is connected to the source land 88 for the W-phase high side through a via hole (not illustrated) extending through the insulation layer 45. The second W-phase conductive trace 105 has a front end portion that is disposed directly above a drain land 91 for the W-phase low side, and that is connected to the drain land 91 for the W-phase low side through a via hole (not illustrated) extending through the insulation layer 45.

A fourth conductive layer 34 includes gate signal lines (not illustrated) of the second switching devices UU2 to WL2, which are provided on an insulation layer 44. The gate signal line of each of the second switching devices UU2 to WL2 is connected to the corresponding gate land (included in the sixth conductive layer 36) through a via hole (not illustrated) extending through the insulation layers 44, 45. In a power steering system including the power module 3B according to the third embodiment, a second motor coil 4B is disposed in the same phase as that of a first motor coil 4A, and current command values Id_2, Iq_2 for a second control unit 10B are respectively identical in sign to current command values Id_1, for a first control unit 10A.

In FIG. 13, arrows illustrated in the conductive traces 71 to 75 included in the second conductive layer 32 and arrows illustrated in the conductive traces 101 to 105 included in the fifth conductive layer 35, denote the directions of currents flowing through the conductive traces 71 to 75 and the conductive traces 101 to 105 when currents flow through the portions of the first driving circuit 6 in the directions as indicated by the arrows in FIG. 5 and currents flow through the portions of the second driving circuit 7 in the same directions as those of the currents flowing through the portions of the first driving circuit 6.

In this case, currents flow at least through a longitudinally-extending portion 71*b* of the first positive-electrode-side power source conductive trace 71 and a longitudinally-extending portion 101*b* of the second positive-electrode-side power source conductive trace 101, which are disposed so as to face each other, in opposite directions, and currents flow at least through a longitudinally-extending portion 72*b* of the first negative-electrode-side power source conductive trace 72 and a longitudinally-extending portion 102*b* of the second negative-electrode-side power source conductive trace 102, which are disposed so as to face each other, in opposite directions. As a result, inductances of the conductive traces 71, 72, 101, 102 can be at least partially reduced. Consequently, the inductances of the conductive traces 71, 72, 101, 102 can be reduced.

In the embodiments described above, the invention is applied to a power module including two driving circuits (three-phase inverters) for driving an electric motor provided with three-phase motor coils for two respective systems. However, the invention may be applied to a power module including two driving circuits (three-phase inverters) for driving two electric motors. For example, the invention may be applied to a power module used in a vehicle steering system including right and left steering operation mechanisms that are used to independently steer right and left steered wheels, and that are individually driven by right and left steering motors, as described in JP 2008-474160 A and JP 2015-20586 A.

While a MOSFET is used as each switching device in the embodiments described above, an insulated gate bipolar transistor (IGBT) or a semiconductor switching device using gallium nitride (GaN) or silicon carbide (Sic) may be used as each switching device.

What is claimed is:

1. A power module comprising:
  a multilayer circuit board having a first principal surface and a second principal surface that is on an opposite side of the multilayer circuit board from the first principal surface;
  a first three-phase inverter including first U-phase upper and lower arms, first V-phase upper and lower arms, and first W-phase upper and lower arms; and
  a second three-phase inverter including second U-phase upper and lower arms, second V-phase upper and lower arms, and second W-phase upper and lower arms,
  the first three-phase inverter and the second three-phase inverter being mounted on the multilayer circuit board so as to be stacked each other, wherein
  where a positive-electrode-side power source conductive trace and a negative-electrode-side power source conductive trace of the first three-phase inverter are defined as a first positive-electrode-side power source conductive trace and a first negative-electrode-side power source conductive trace, respectively, and a positive-electrode-side power source conductive trace and a negative-electrode-side power source conductive trace of the second three-phase inverter are defined as a second positive-electrode-side power source conductive trace and a second negative-electrode-side power source conductive trace, respectively,
    the first positive-electrode-side power source conductive trace and the second negative-electrode-side power source conductive trace are disposed so as to at least partially face each other in a stacking direction of the multilayer circuit board, such that a direction in which a current flows through the first positive-electrode-side power source conductive trace and a direction in which a current flows through the second negative-electrode-side power source conductive trace are opposite to each other, in a facing section in which the first positive-electrode-side power source conductive trace and the second negative-electrode-side power source conductive trace at least partially face each other, and
    the first negative-electrode-side power source conductive trace and the second positive-electrode-side power source conductive trace are disposed so as to at least partially face each other in the stacking direction of the multilayer circuit board, such that a direction in which a current flows through the first negative-electrode-side power source conductive trace and a direction in which a current flows through the second positive-electrode-side power source conductive trace are opposite to each other, in a facing section in which the first negative-electrode-side power source conductive trace and the second positive-electrode-side power source conductive trace at least partially face each other.

2. The power module according to claim 1, wherein
  where a U-phase conductive trace connecting the first U-phase upper and lower arms to each other, a V-phase conductive trace connecting the first V-phase upper and lower arms to each other, and a W-phase conductive trace connecting the first W-phase upper and lower arms to each other are respectively defined as a first U-phase conductive trace, a first V-phase conductive trace, and a first W-phase conductive trace, and
  where a U-phase conductive trace connecting the second U-phase upper and lower arms to each other, a V-phase conductive trace connecting the second V-phase upper and lower arms to each other, and a W-phase conductive trace connecting the second W-phase upper and lower arms to each other are respectively defined as a second U-phase conductive trace, a second V-phase conductive trace, and a second W-phase conductive trace,
    the first U-phase conductive trace and the second U-phase conductive trace are disposed so as to thee each other in the stacking direction of the multilayer circuit board, the first V-phase conductive trace and the second V-phase conductive trace are disposed so as to face each other in the stacking direction of the multilayer circuit board, and the first W-phase conductive trace and the second W-phase conductive trace are disposed so as to face each other in the stacking direction of the multilayer circuit board.

3. The power module according to claim 2, wherein
  the first U-phase upper and lower arms, the first V-phase upper and lower arms, and the first W-phase upper and lower arms are mounted on the first principal surface of the multilayer circuit board,
  the second U-phase upper and lower arms, the second V-phase upper and lower arms, and the second W-phase upper and lower arms are mounted on the second principal surface of the multilayer circuit board,
  at least the first positive-electrode-side power source conductive trace and the first negative-electrode-side power source conductive trace among the first positive-electrode-side power source conductive trace, the first negative-electrode-side power source conductive trace, the first U-phase conductive trace, the first V-phase conductive trace, and the first W-phase conductive trace are provided in a first inner layer between the first principal surface and the second principal surface of the multilayer circuit board, and at least the second positive-electrode-side power source conductive trace and the second negative-electrode-side power source conductive trace among the second positive-electrode-side power source conductive trace, the second negative-electrode-side power source conductive trace, the second U-phase conductive trace, the second V-phase conductive trace, and the second W-phase conductive trace are provided in a second inner layer between the second principal surface of the multilayer circuit board and the first inner layer.

4. The power module according to claim 3, wherein
the first positive-electrode-side power source conductive trace, the first negative-electrode-side power source conductive trace, the first U-phase conductive trace, the first V-phase conductive trace, and the first W-phase conductive trace are provided in the first inner layer, and the second positive-electrode-side power source conductive trace, the second negative-electrode-side power source conductive trace, the second U-phase conductive trace, the second V-phase conductive trace, and the second W-phase conductive trace are provided in the second inner layer.

5. A power module comprising:
a multilayer circuit board having a first principal surface and a second principal surface that is on an opposite side of the multilayer circuit board from the first principal surface;
a first three-phase inverter including first U-phase upper and lower arms, first V-phase upper and lower arms, and first W-phase upper and lower arms: and
a second three-phase inverter including second U-phase upper and lower arms, second V-phase upper and lower arms, and second W-phase upper and lower arms,
the first three-phase inverter and the second three-phase inverter being mounted on the multilayer circuit board so as to be stacked each other, wherein
where a positive-electrode-side power source conductive trace and a negative-electrode-side power source conductive trace of the first three-phase inverter are defined as a first positive-electrode-side power source conductive trace and a first negative-electrode-side power source conductive trace, respectively, and a positive-electrode-side power source conductive trace and a negative-electrode-side power source conductive trace of the second three-phase inverter are defined as a second positive-electrode-side power source conductive trace and a second negative-electrode-side power source conductive trace, respectively,
the first positive-electrode-side power source conductive trace and the second positive-electrode-side power source conductive trace are disposed so as to at least partially face each other in a stacking direction of the multilayer circuit board, such that a direction in which a current flows through the first positive-electrode-side power source conductive trace and a direction in which a current flows through the second positive-electrode-side power source conductive trace are opposite to each other, in a facing section in which the first positive-electrode-side power source conductive trace and the second positive-electrode-side power source conductive trace at least partially face each other, and
the first negative-electrode-side power source conductive trace and the second negative-electrode-side power source conductive trace are disposed so as to at least partially face each other in the stacking direction of the multilayer circuit board, such that a direction in which a current flows through the first negative-electrode-side power source conductive trace and a direction in which a current flows through the second negative-electrode-side power source conductive trace are opposite to each other, in a facing section in which the first negative-electrode-side power source conductive trace and the second negative-electrode-side power source conductive trace at least partially face each other.

6. The power module according to claim 5, wherein
the first U-phase upper and lower arms, the first V-phase upper and lower arms, and the first W-phase upper and lower arms are mounted on the first principal surface of the multilayer circuit board,
the second U-phase upper and lower arms, the second V-phase upper and lower arms, and the second W-phase upper and lower arms are mounted on the second principal surface of the multi layer circuit board,
at least the first positive-electrode-side power source conductive trace and the first negative-electrode-side power source conductive trace among the first positive-electrode-side power source conductive trace, the first negative-electrode-side power source conductive trace, a first U-phase conductive trace, a first V-phase conductive trace, and a first W-phase conductive trace are provided in a first inner layer between the first principal surface and the second principal surface of the multilayer circuit board, and
at least the second positive-electrode-side power source conductive trace and the second negative-electrode-side power source conductive trace among the second positive-electrode-side power source conductive trace, the second negative-electrode-side power source conductive trace, a second U-phase conductive trace, a second V-phase conductive trace, and a second W-phase conductive trace are provided in a second inner layer between the second principal surface of the multilayer circuit board and the first inner layer.

* * * * *